(12) United States Patent
Narita

(10) Patent No.: US 7,868,447 B2
(45) Date of Patent: Jan. 11, 2011

(54) SOLID-STATE IMAGE SENSING APPARATUS AND PACKAGE OF SAME

(75) Inventor: Hirochika Narita, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/390,714

(22) Filed: Feb. 23, 2009

(65) Prior Publication Data

US 2009/0224394 A1    Sep. 10, 2009

(30) Foreign Application Priority Data

Mar. 6, 2008   (JP) .............................. 2008-056238
Feb. 12, 2009  (JP) .............................. 2009-029244

(51) Int. Cl.
    *H01L 23/495* (2006.01)
(52) U.S. Cl. ............................... 257/696; 257/E23.048
(58) Field of Classification Search ................ 257/690, 257/692, 696, E23.045, E23.046, E23.047, 257/E23.048
    See application file for complete search history.

(56) References Cited

U.S. PATENT DOCUMENTS

| | | | | |
|---|---|---|---|---|
| 6,081,027 A | * | 6/2000 | Akram | .......................... 257/707 |
| 6,114,759 A | * | 9/2000 | Okuaki | .......................... 257/692 |
| 2003/0052381 A1 | * | 3/2003 | Andoh et al. | .................. 257/433 |
| 2004/0145043 A1 | * | 7/2004 | Hayashi et al. | ............... 257/696 |
| 2007/0029650 A1 | * | 2/2007 | Lim et al. | ..................... 257/666 |
| 2007/0057361 A1 | * | 3/2007 | Lange et al. | .................. 257/696 |
| 2009/0146274 A1 | * | 6/2009 | Yang et al. | ................... 257/666 |

FOREIGN PATENT DOCUMENTS

| | | |
|---|---|---|
| JP | 6-45724 | 2/1994 |
| JP | 9-246452 | 9/1997 |
| JP | 11-307708 | 11/1999 |
| JP | 2007-281451 | 10/2007 |

* cited by examiner

*Primary Examiner*—Sue Purvis
*Assistant Examiner*—Benjamin P Sandvik
(74) *Attorney, Agent, or Firm*—Young & Thompson

(57) ABSTRACT

Warpage and twist of a solid-state image sensing apparatus is controlled, thereby preventing displacement occurring to the solid-state image sensing apparatus when it is mounted on a printed circuit board. The solid-state image sensing apparatus comprises a plurality of outer leads, and the outer leads each comprises a horizontal portion protruding in the horizontal direction from a side face of a package body for encasing a solid-state image sensing chip therein, an end portion extending in a direction orthogonal to the horizontal portion, and disposed directly below the horizontal portion, a mid portion positioned between the horizontal portion, and the end portion, a first bend formed between the horizontal portion, and the mid portion, and a second bend formed between the mid portion, and the end portion.

17 Claims, 17 Drawing Sheets

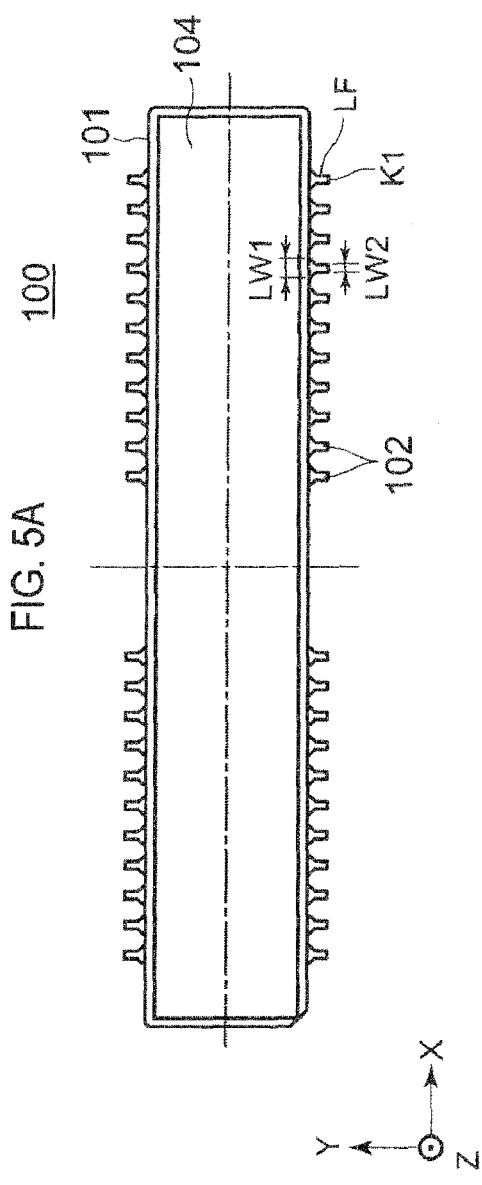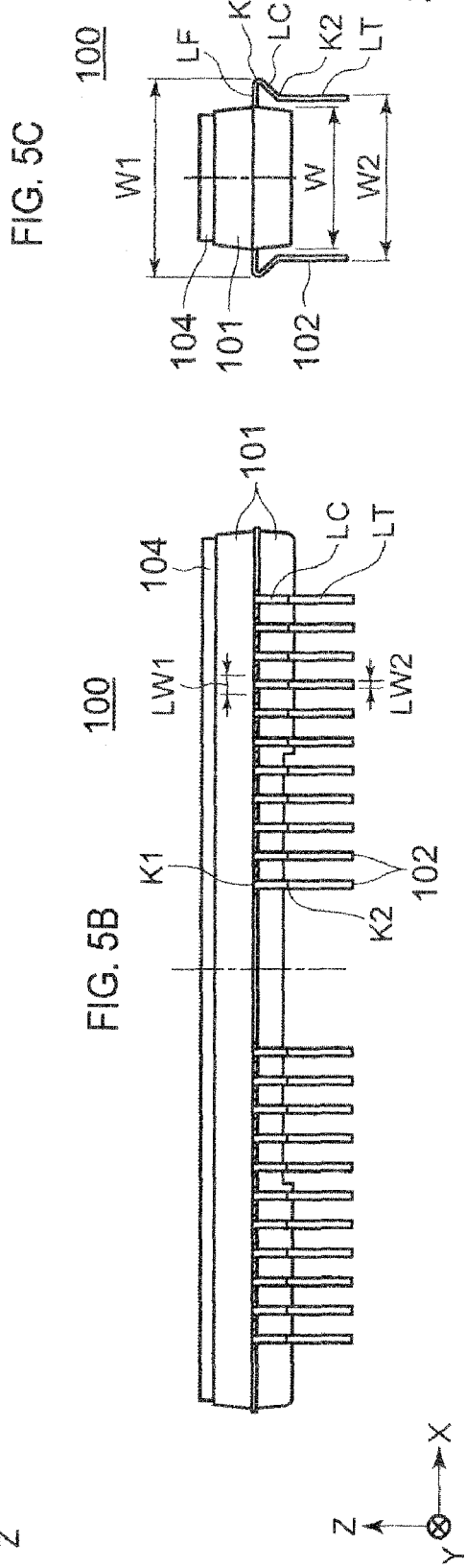

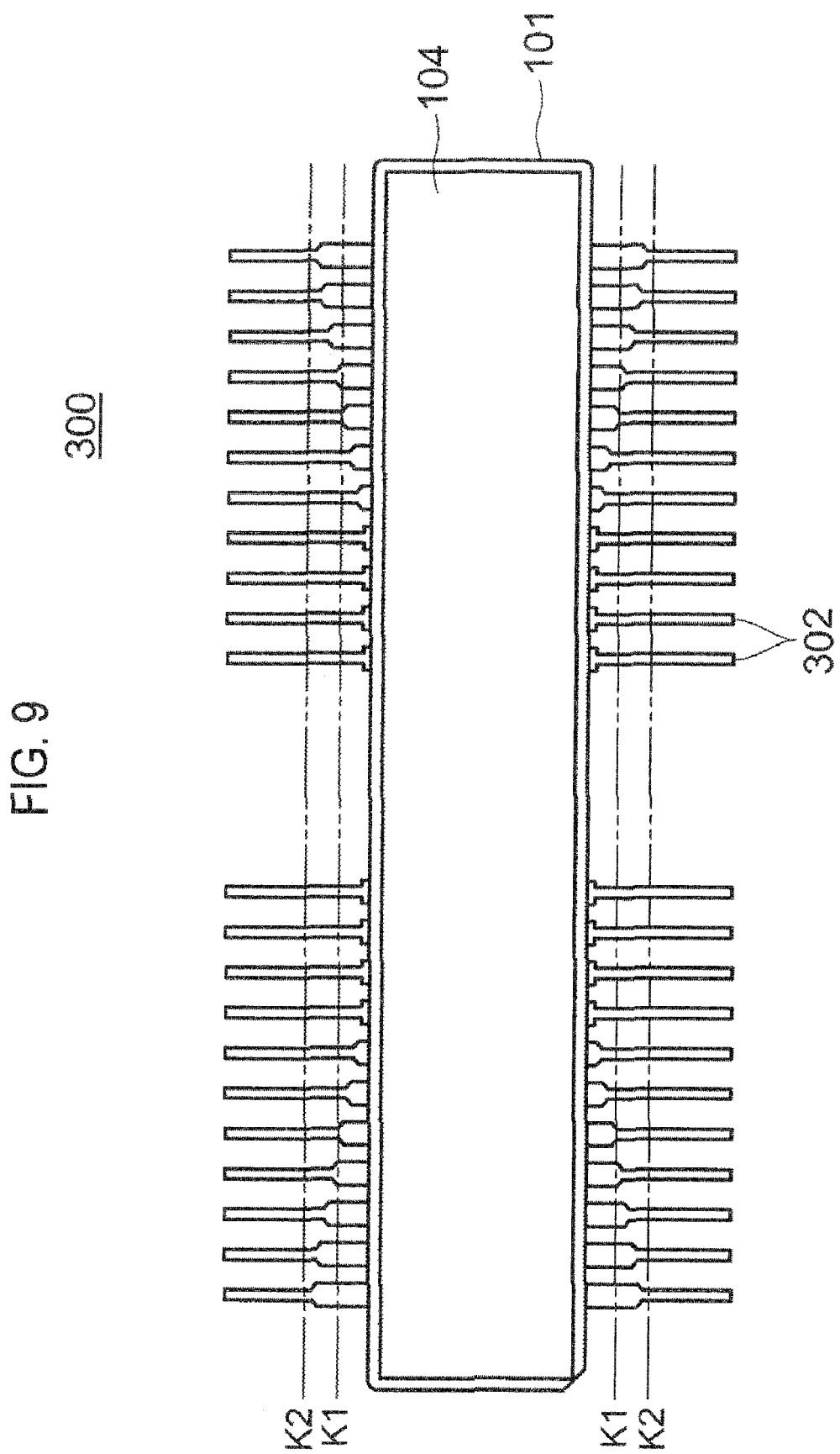

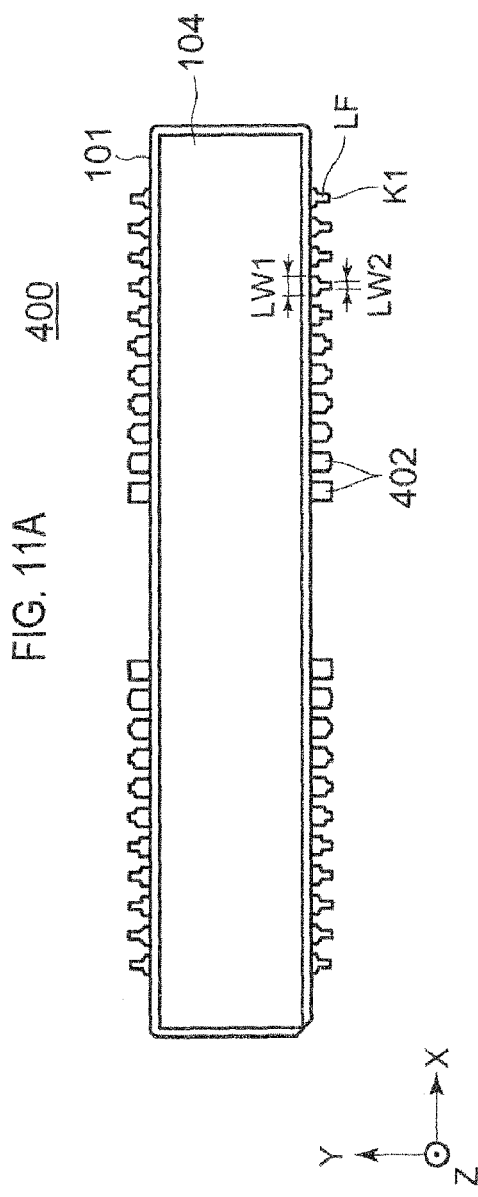
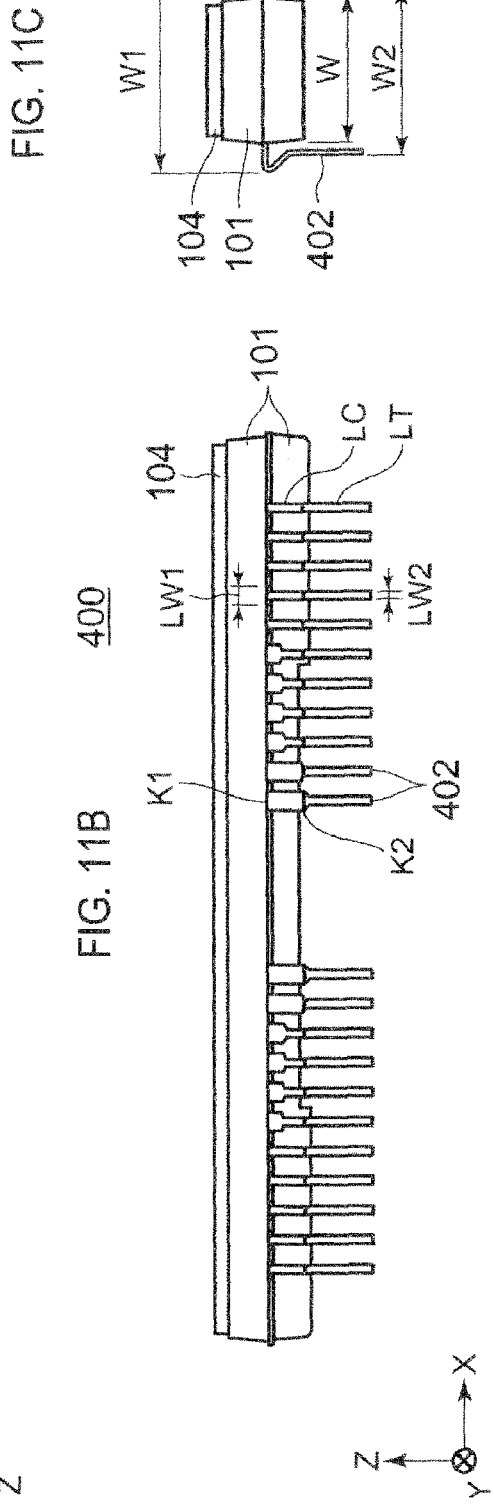
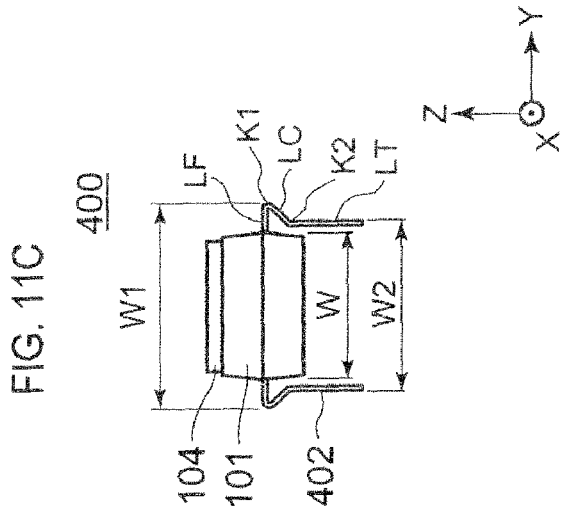
FIG. 11A
FIG. 11B
FIG. 11C

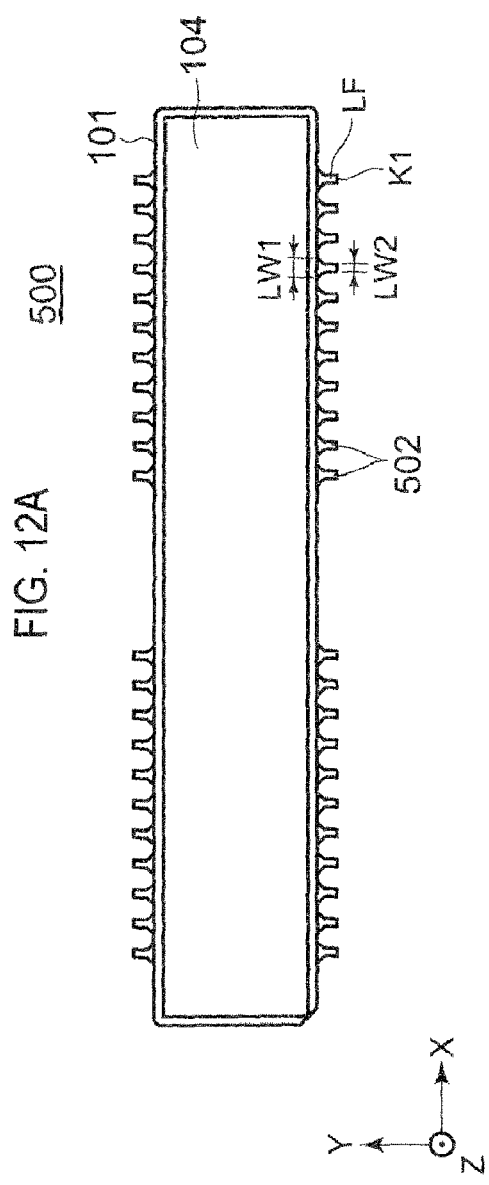
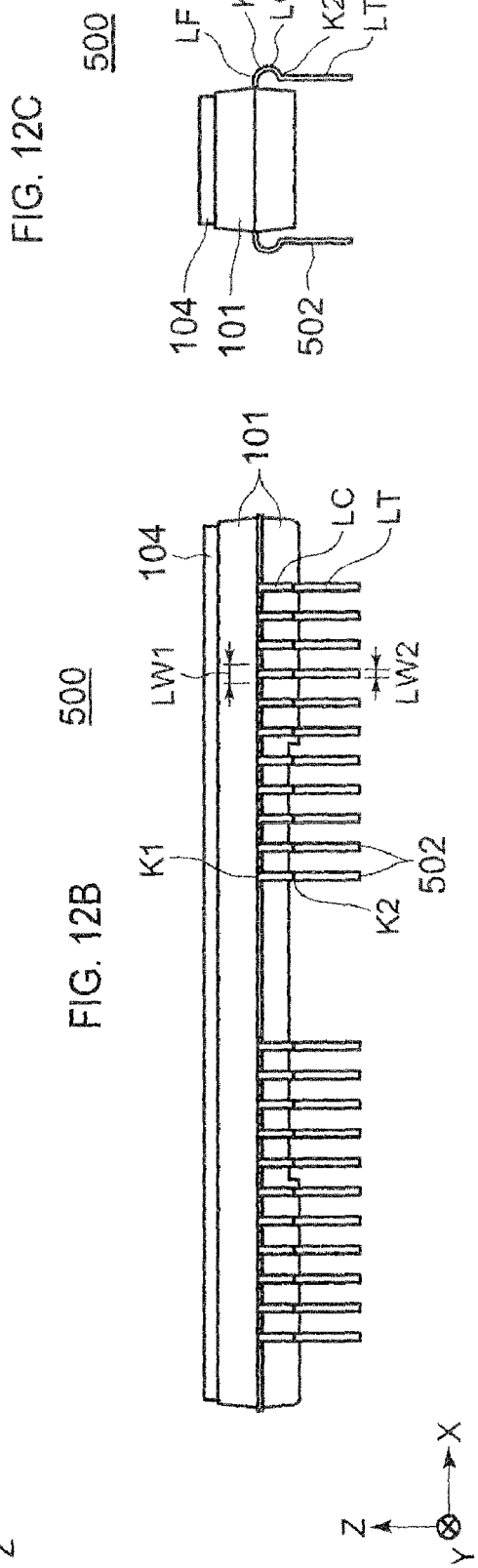
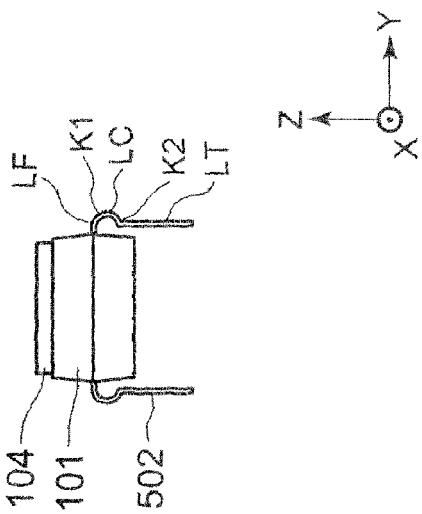
FIG. 12A
FIG. 12B
FIG. 12C

SOLID-STATE IMAGE SENSING APPARATUS AND PACKAGE OF SAME

BACKGROUND

1. Field of the Invention

The present invention relates to a solid-state image sensing apparatus, and a package of the solid-state image sensing apparatus, and in particular, to a solid-state image sensing apparatus suitable for use in a linear sensor, and a package of the solid-state image sensing apparatus.

2. Description of Related Art

For a solid-state image sensing apparatus in electronic equipment such as a copy machine, scanner, fax machine, and so forth, for reading images and character information, a one-dimensional solid-state image sensing chip made up by arranging photodiodes in a line, the so-called linear sensor, has been in wide spread use. Much use has been made of, for example, a CCD (Charge-Coupled Device) linear sensor, and a CMOS (Complementary Metal-Oxide Semiconductor) linear sensor Those solid-state image sensing apparatuses are attached to a printed circuit board to be then mounted on the electronic equipment. There are cases where an optical apparatus (reducing glass) for image reduction, together with the solid-state image sensing apparatus, is attached to the printed circuit board.

In order to accurately read information on images and so forth, the electronic equipment is optically adjusted with precision before assembling. However, when the electronic equipment is in operation, heat evolution occurs therein, so that the so-called warpage (the printed circuit board is distorted or kinked by the agency of heat) occurs to the printed circuit board with the solid-state image sensing apparatus attached thereto. As a result, warpage occurs to the solid-state image sensing apparatus as well, thereby causing an optical distance between the photodiodes of the solid-state image sensing apparatus to undergo displacement, so that a subject for image-sensing will be out of focus, resulting in deterioration in picture quality. As occurrence of the heat evolution has since become more pronounced due to recent increase in read rate, so more serious has become a problem of the warpage occurring to the solid-state image sensing apparatus.

In JP-A No. 2007-281451 (hereinafter referred to as a first prior art), there has been described a solid-state image sensing apparatus wherein a shape of each of outer leads is devised such that a deforming stress applied to a printed circuit board is absorbed by the outer leads, thereby mitigating a stress applicable to a solid-state image sensing chip. There will be described hereinafter a solid-state image sensing apparatus 10 as set forth in the first prior art with reference to the accompanying drawings.

FIG. 1 is a perspective view of the solid-state image sensing apparatus 10, FIG. 2 a sectional view taken on line II-II, in FIG. 1, FIG. 3A is a plan view of a lead frame 2 used in the solid-state image sensing apparatus 10, and FIG. 3B is a detailed plan view of outer leads $2b_1$.

The solid-state image sensing apparatus 10, shown in FIG. 1, comprises a package body 1 made of a synthetic resin, having long sides and short sides, a solid-state image sensing chip 3 encased in a recess formed in the package body 1, and a plurality of the outer leads $2b_1$, disposed so as to be arranged on a side face of the package body 1, in the direction of the long side thereof. A plurality of the outer leads $2b_1$ are similarly disposed on the opposite side face of the package body 1, thereby making up the so-called DIP (Dual Inline Package) structure. A transparent sheet 4 excellent in light transmittance is mounted on the top surface of the package body 1, thereby sealing the recess, and the solid-state image sensing chip 3. The solid-state image sensing apparatus 10 is connected to a printed circuit board 20. Each of the plurality of the outer leads $2b_1$ has a bend portion $2b_{10}$.

As shown in FIG. 2, the outer lead $2b_1$ each are linear as seen from the direction of the short side of the package body 1 (in the x-direction in FIG. 1) The solid-state image sensing chip 3 is mounted so as to be in the pattern of an island to be electrically continuous with inner leads $2b_2$, respectively, by a bonding wire 5.

FIG. 3A is the plan view of the lead frame 2 used in the solid-state image sensing apparatus 10, and FIG. 3B is the detailed plan view of the outer lead portion $2b_1$. The bent portion $2b_{10}$ is in a shape resembling the letter S, comprising a bend $2b_{11}$ arc-like in shape, and a bend $2b_{12}$ arc-like in shape, disposed on the right side, and the left side of the center line $Z_0$ of the outer lead portion $2b_1$ respectively. When the printed circuit board is expanded in the direction parallel with the long side of the package body 1 (in the x direction) due heat evolution, an end portion A of the outer lead $2b_1$ fixed to the printed circuit board is caused to move in the x direction. A force pulling the bent portion $2b_{10}$ directly below via the end portion A will act on the bent portion $2b_{10}$, however, because the bend $2b_{11}$ and the bend $2b_{12}$ are deformed, a stress exerted on the package body 1 via a root $2b_{13}$ of the outer lead $2b_1$ is controlled. As a result, a warpage amount of the solid-state image sensing chip 3 can be controlled to a small value.

Besides the above-described, a semiconductor device, and an electronic component, wherein a bent portion is provided halfway through each of outer leads, thereby absorbing a stress, have been disclosed in JP-A No. 9(1997)-246452 (hereinafter referred to as a second prior art), JP-A No. 11(1999)-307708 (hereinafter referred to as a third prior art), and JP-A No. 6(1994)-45724 (hereinafter referred to as a fourth prior art), respectively.

The inventor, however, has since realized that those prior arts each have the following problem.

With the solid-state image sensing apparatus 10 according to the first prior art, if a pitch between the outer leads $2b_1$ adjacent to each other becomes narrow, the bent portion $2b_{10}$ should be rendered smaller in width in order to prevent the outer leads $2b_1$ from coming into contact (being shorted) with each other. More specifically, the bend $2b_{11}$ and the bend $2b_{12}$ are reduced in size, so that an effect of controlling the stress exerted on the package body 1 will be decreased.

In contrast, in the case of the second to the fourth prior arts, respectively, respective bends are shown in as bent-state when seen from a direction in which respective outer leads protrude toward respective side faces of a package body (in the same direction as in FIG. 2), and it is presumed that the respective outer leads are shown linear as seen in a direction in which the respective outer leads are rotated through 90 degrees sideways (in the Y direction in FIG. 1). Accordingly, with the second to the fourth prior arts, respectively, even if respective bends are increased in size, it seems that there is no risk of the outer leads adjacent to each other coming into contact with each other.

However, the second and third prior arts each are not suited for application to a slender solid-state image sensing apparatus such as the linear sensor because the outer leads are of a surface-mounting type. That is, the outer leads simply bonded to the surface of a printed circuit board is unable to fully absorb a stress applied on the slender solid-state image sensing apparatus, so that the outer leads will be exfoliated.

Meanwhile, in the fourth prior art, there is disclosed a mount-structure of a component, wherein a lead is inserted into a hole formed in a printed circuit board to be soldered thereto. As shown in FIG. 4, a lead 42 of a component 41 is provided with elasticity by bending the same, and an end portion 47 of the lead 42 is inserted into a hole of a printed circuit board 44. A bend portion 43 is butted against an upper region around the hole, and the end portion 47 of the lead 42 is bonded to a pattern 45 of the printed circuit board 44 with the use of a solder 46.

The bend portion 43 serves as a stopper for preventing the lead 42 from being further inserted into the hole of the printed circuit board 44. That is, the bend portion 43 is formed in order to keep the component 41 out of contact with the printed circuit board 44. If the component 41 is the solid-state image sensing apparatus, variation and distortion in the shape of the bend portion 43 will cause the solid-state image sensing apparatus to be tilted, so that a subject for image-sensing will be out of focus, thereby deteriorating picture quality.

SUMMARY

In accordance with one aspect of the invention, there is provided a solid-state image sensing apparatus comprising a plurality of outer leads, the outer leads each comprising a horizontal portion protruding in the horizontal direction from a side face of a package body, an end portion extending in a direction orthogonal to the horizontal portion, and disposed directly below the horizontal portion, a mid portion positioned between the horizontal portion and the end portion, a first bend formed between the horizontal portion and the mid portion, and a second bend formed between the mid portion and the end portion.

In accordance with another aspect of the invention, there is provided a package of a solid-state image sensing apparatus, said package comprising a plurality of outer leads, the outer leads each comprising a horizontal portion protruding in the horizontal direction from a side face of a package body, an end portion extending in a direction orthogonal to the horizontal portion, and disposed directly below the horizontal portion, a mid portion positioned between the horizontal portion and the end portion, a first bend formed between the horizontal portion and the mid portion, and a second bend formed between the mid portion and the end portion.

In so doing, it is possible to prevent displacement from occurring to the solid-state image sensing apparatus when it is mounted on a printed circuit board even if there occur variation and distortion in the shape of the outer lead while controlling warpage and twist of the solid-state image sensing apparatus.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 5A is a top plan view showing a solid-state image sensing apparatus 100 according to Embodiment 1 of the invention;

FIG. 5B is a side view of the solid-state image sensing apparatus 100 as seen in the y-direction;

FIG. 5C is a side view of the solid-state image sensing apparatus 100 as seen in the x-direction;

FIG. 9 is a top plan view of the solid-state image sensing apparatus 300 prior to bending outer leads 302;

FIG. 11A is a top plan view showing a solid-state image sensing apparatus 400 according to Embodiment 4 of the invention;

FIG. 11B is a side view of the solid-state image sensing apparatus 400 as seen in the y-direction;

FIG. 11C is a side view of the solid-state image sensing apparatus 400 as seen in the x-direction;

FIG. 12A is a top plan view showing a solid-state image sensing apparatus 500 according to Embodiment 5 of the invention;

FIG. 12B is a side view of the solid-state image sensing apparatus 500 as seen in the y-direction;

FIG. 12C a side view of the solid-state image sensing apparatus 500 as seen in the x-direction;

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Figure 17:
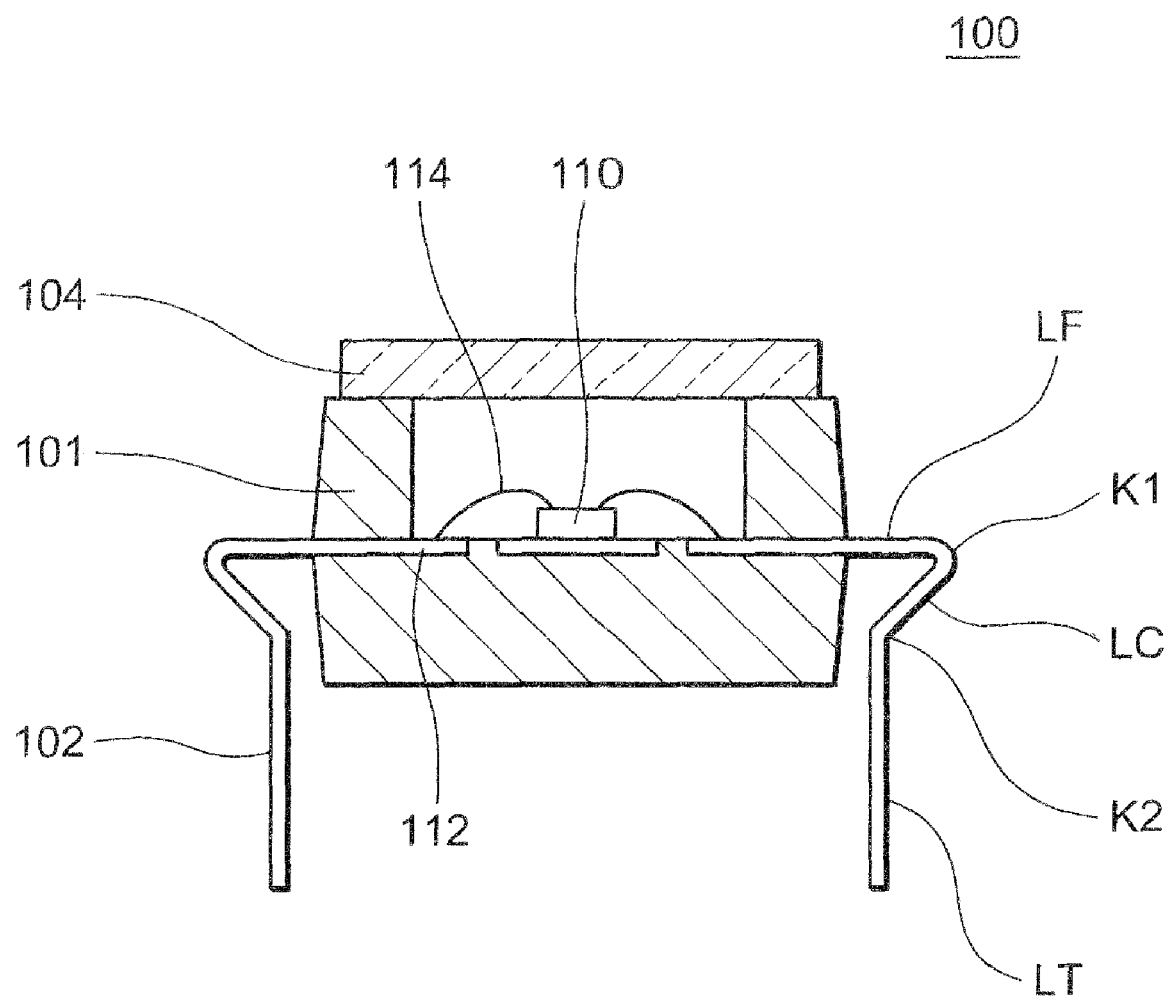
FIG. 17 is a sectional view of the solid-state image sensing apparatus 100 as seen in the x-direction.

FIG. 5A is a top plan view showing a solid-state image sensing apparatus 100 according to Embodiment 1 of the invention, FIG. 5B is a side view of the solid-state image sensing apparatus 100 as seen in the y-direction, FIG. 5C is a side view of the solid-state image sensing apparatus 100 as seen in the x-direction, and FIG. 17 is a sectional view of the solid-state image sensing apparatus 100 as seen in the x-direction. The solid-state image sensing apparatus 100 is of the so-called DIP (Dual Inline Package) structure wherein a plurality of outer leads 102 are line up on respective side faces of a package body 101, along the long side thereof, and the outer leads 102 are disposed so as to be symmetric with respect to a dash and dotted line shown in each of FIGS. 5A to 5C. As shown in FIG. 17, a recess (a room space) is formed in the package body 101, and a solid-state image sensing chip 110 is mounted in the recess. The solid-state image sensing chip 110 is electrically connected to respective inner leads 112 by a bonding wire 114, and so forth. A transparent sheet 104 is mounted on the top of the package body 101, thereby sealing the recess.

As shown in FIGS. 5C and 17, the outer lead 102 comprises a horizontal portion LF protruding from the side face of the package body 101, an end portion LT extending in a direction orthogonal to the horizontal portion LF, disposed directly below the horizontal portion LF, and a mid portion LC positioned between the horizontal portion LF, and the end portion LT. A first bend K1 is formed between the horizontal portion LF, and the mid portion LC, and a second bend K2 is formed between the mid portion LC, and the end portion LT. More specifically, the outer lead 102 is horizontally protruded to be folded back toward the package body 101 so as to form an acute angle at the first bend K1, and is again folded back so as to form an obtuse angle at the second bend K2 such that the end portion LT is oriented toward directly below the horizontal portion LF. With the solid-state image sensing apparatus 100, a right triangle is formed by an intersection between a line extended upward from the center line of the end portion LT and the horizontal portion LF, the first bend K1, and the second bend K2. Typically, there is formed a right isosceles triangle, with the interior angle 45° of the first bend K1. Since the outer lead 102 has a thickness (for example, 0.25 mm) in actuality, the first bend K1 will be in the form of an arc (for example, 0.2 mm in radius of an inner curvature). The end portion LT is inserted into a hole in a printed circuit board (not shown) to be soldered to a pattern formed on the printed circuit board. An interval W2 between the respective end portions LT of the outer leads 102, in pairs, disposed on the respective sides of the package body 101, is rendered smaller than an interval W1 between the first bends K1, thereby preventing any portion of an area to be soldered from lying outside the respective first bends K1.

The second bend K2 is formed above the bottom face of the package body 101, and the interval W2 between the second bends K2 is wider than a width W of the package body 101. By so doing, the bottom face of the package body 101 can be brought into close contact with the printed circuit board when the solid-state image sensing apparatus 100 is to be soldered to the printed circuit board. Consequently, even if there occur variation and distortion in the shape of the outer lead, this will not cause the solid-state image sensing chip to be tilted, so that it is possible to prevent a subject for image-sensing from being out of focus.

When the solid-state image sensing apparatus 100 is looked at from the side face thereof, where the outer leads 102 protrude (in the Y direction), the center line of the outer lead 102 is seen linear as shown in FIG. 5B. The first bend K1, the mid portion LC, the second bend K2, and the end portion LT are visible, and those portions of the outer lead 102 are identical in width LW2 (a second width) to each other. A part of the horizontal portion LF, having the same width LW2 as that of the first bend K1, is not visible because it is overlapped by the first bend K1, however, a root portion of the horizontal portion LF, protruding from the side face side of the package body 101, has a width LW1 (a first width) slightly wider than the second width, and is therefore partly visible. Further, when the solid-state image sensing apparatus 100 is looked at from the top surface side thereof (in the z-direction), the horizontal portion LF, and the first bend K1 are visible, as shown in FIG. 5A, however, the second bend K2, the mid portion LC, and the end portion LT are not visible because those are directly below the horizontal portion LF. Further, the package body 101 may have a cutout portion provided at the center of the bottom thereof, as shown in FIG. 5B, but the cutout portion may be dispensed with.

Figure 6B:
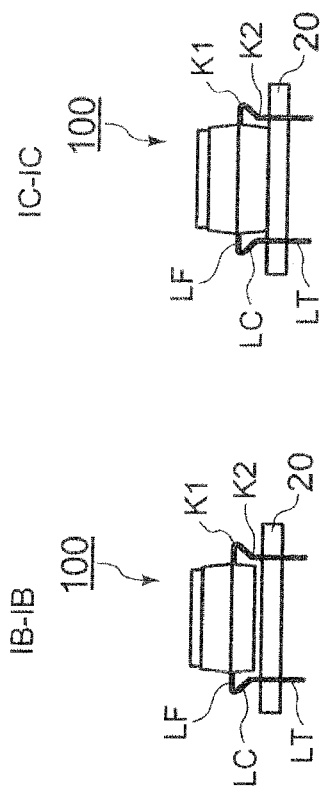
FIGS. 6A to 6C each are a view of the solid-state image sensing apparatus 100 mounted on a printed circuit board 20, showing the printed circuit board 20 in as-unwarped state.
Figure 6C:
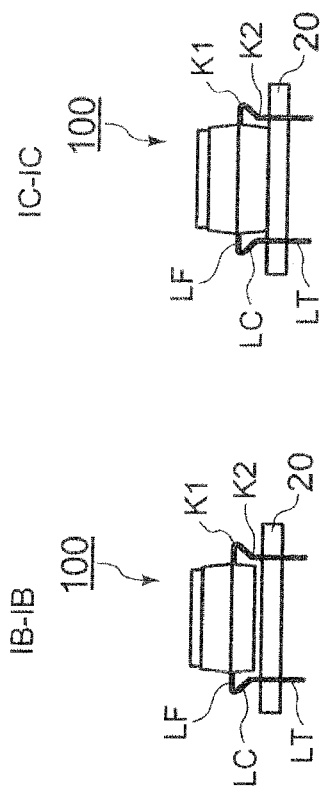
Figure 6A:
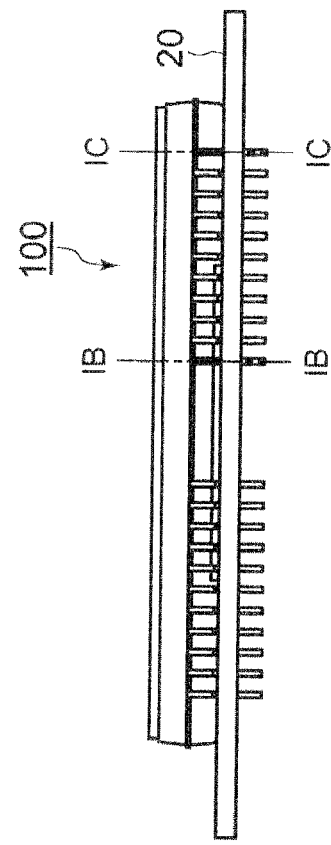
Figure 6E:
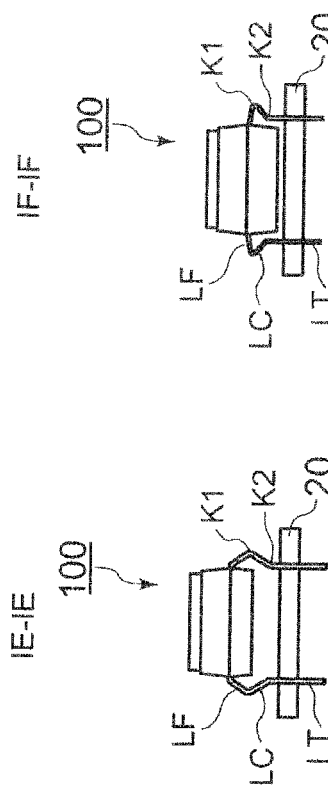
FIGS. 6D to 6F each are a view showing the printed circuit board 20 with the solid-state image sensing apparatus 100 mounted thereon, in as concavely-warped state.
Figure 6F:
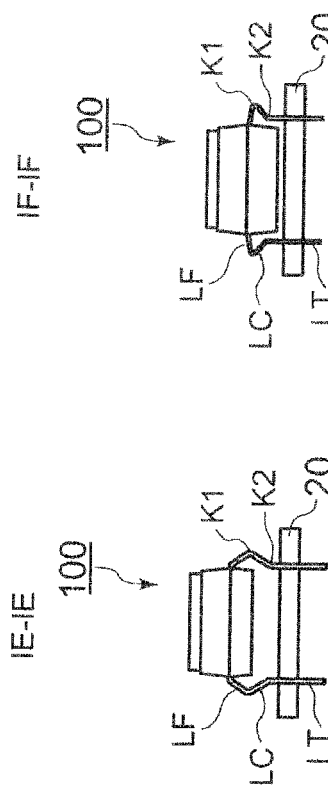
Figure 6D:
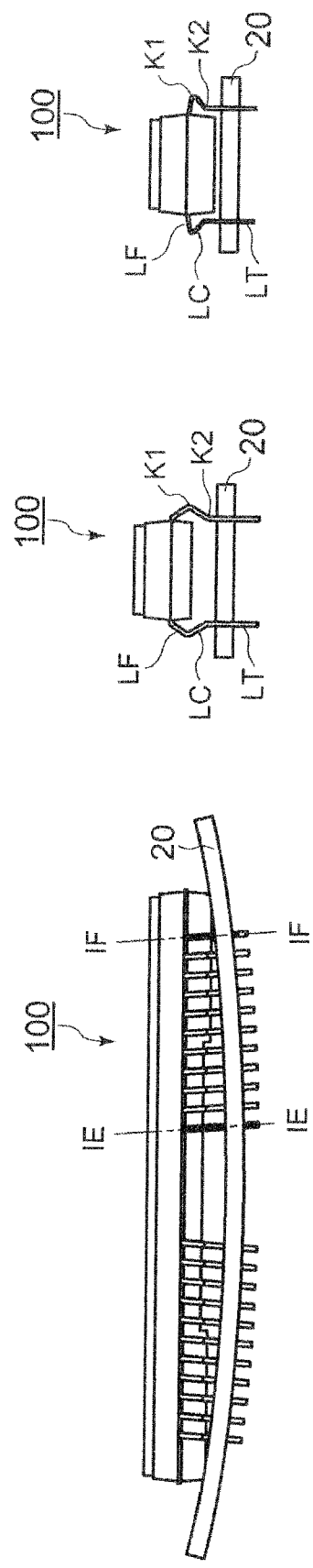

FIG. 6A is a side view of the solid-state image sensing apparatus 100 mounted on a printed circuit board 20, showing the printed circuit board 20 in as-unwarped state, and FIGS. 6C, 6C each are a sectional view taken on lines IB-IB, IC-IC, in FIG. 6A, respectively. FIG. 6D is a side view showing the printed circuit board 20 with the solid-state image sensing apparatus 100 mounted thereon, in as concavely-warped state, and FIGS. 6E, 6F each are a sectional view taken on lines IE-IE, IF-IF, in FIG. 6A, respectively.

As is evident from FIG. 6D, when the printed circuit board 20 is concavely warped, respective ends of the solid-state image sensing apparatus 100 are in contact with the printed circuit board 20, and a force pulling the outer lead 102 downward according to an amount of dent will act on the respective outer leads 102. As shown in FIGS. 6E, 6F, respectively, the root portion of the horizontal portion LF (the portion having the first width LW1) is kept in the horizontal state, but the portion of the outer lead 102, extended from the root portion, having the second width LW2 narrower than the first width LW1, are tilted downward, whereupon the first bend K1, and the second bend K2 are deformed in such a way as to open up corners formed at the respective bends, thereby absorbing stress. It is observed that in parts of the printed circuit board 20, in the vicinity of the center thereof (FIG. 6E), where the amount of the dent is larger, magnitude of tilting of the horizontal portion LF as well as an extent to which the respective corners at the first bend K1, and the second bend K2 are opened is greater than those at the respective ends of the printed circuit board 20. Thus, the deformation of the outer leads 102, due to warpage of the printed circuit board, can control the warpage of the package body 101. Accordingly, the warpage amount of the solid-state image sensing chip encased in the package body 101 can be controlled, thereby preventing the subject for image-sensing from being out of focus.

Further, since a linear sensor is slender in shape, if forces directed in directions opposite to each other are applied to respective ends thereof, this will render the linear sensor susceptible to be twisted, and there occur a region where a force pulling downward according to an amount of twist is applied, and a region where a force pulling upward is applied. In contrast, with the solid-state image sensing apparatus 100, since the horizontal portion LF, the first bend K1, and the second bend K2 each are deformed according to the amount of the twist, twist of the package body 101 is under control. In FIGS. 6D to 6F, there is shown the state where the printed circuit board 20 with the solid-state image sensing apparatus 100 mounted thereon is concavely warped, however, if the printed circuit board 20 is warped in an inverted orientation (convexly), the outer leads 102 in the vicinity of the center of the printed circuit board 20 undergo less deformation while the outer leads 102 at the respective ends thereof undergo larger deformation, thereby controlling the warpage amount of the package body 101.

Figure 7A:
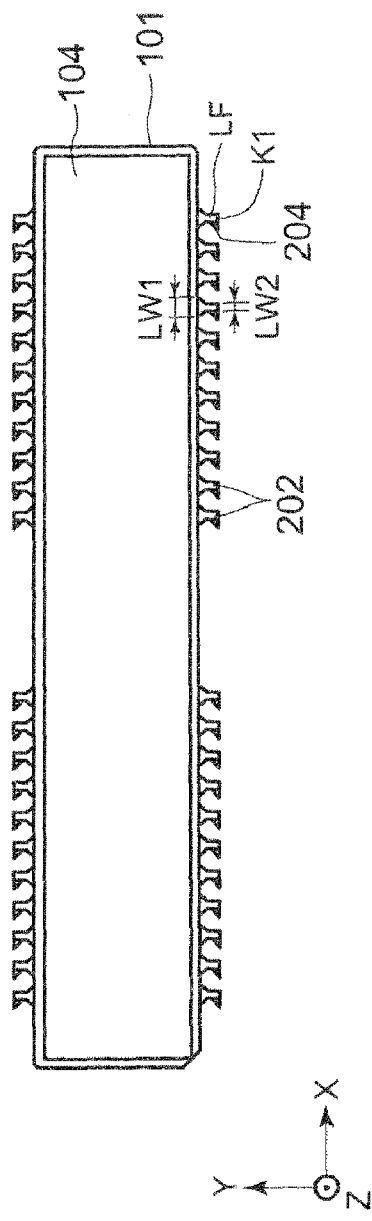
FIG. 7A is a top plan view showing a solid-state image sensing apparatus 200 according to Embodiment 2 of the invention.
Figure 7B:
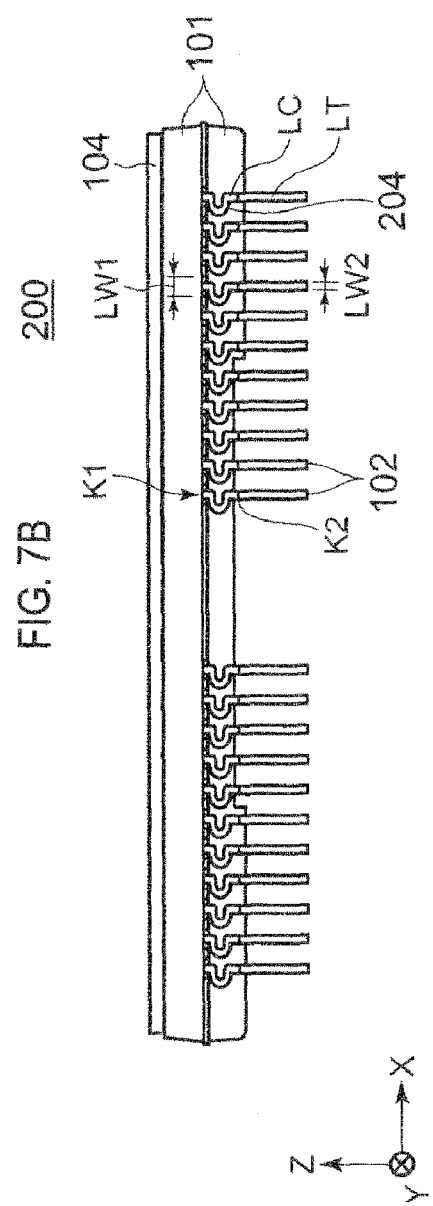
FIG. 7B is a side view of the solid-state image sensing apparatus 200 as seen in the y-direction.
Figure 7C:
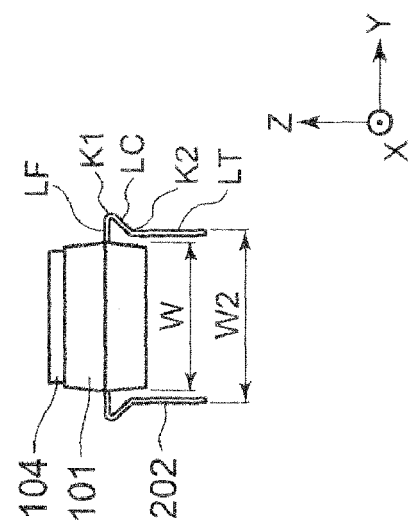
FIG. 7C is a side view of the solid-state image sensing apparatus 200 as seen in the x-direction.

FIG. 7A is a top plan view showing a solid-state image sensing apparatus 200 according to Embodiment 2 of the invention, FIG. 7B a side view of the solid-state image sensing apparatus 200 as seen in the y-direction, and FIG. 7C a side view of the solid-state image sensing apparatus 200 as seen in the x-direction. The solid-state image sensing apparatus 200 has a feature in that a mid portion LC of an outer lead 202 further has a bend 204 in addition to the feature of the solid-state image sensing apparatus 100. As shown in FIG. 7B, the bend 204 is bent toward the outer lead 202 adjacent thereto instead of being disposed directly below a horizontal portion LF of the outer lead 202. As in the case of the solid-state image sensing apparatus 100, a second bend K2 is formed above the bottom face of a package body 101, and an interval W2 between the second bends K2 is wider than the width W of the package body 101. An end portion LT as well as the second bend K2 of the outer lead 202 is disposed directly below the horizontal portion LF. As is the case with the solid-state image sensing apparatus 100, the solid-state image sensing apparatus 200 can be soldered to a printed circuit board by bringing the bottom face of the package body 101 into close contact with the printed circuit board.

With the solid-state image sensing apparatus 200, because deformation occurs to the bend 204 in addition to the horizontal portion LF, a first bend K1, and the second bend K2, there occurs enhancement in the effect of preventing warpage and twist of the package body 101 (that is, the solid-state image sensing chip). However, if a pitch between the outer leads 202 adjacent to each other becomes narrower, the radius of an inner curvature of the bend 204 should be rendered smaller, so that the solid-state image sensing apparatus 200 may not be much different in effect of absorbing stress from the solid-state image sensing apparatus 100.

Figure 8A:
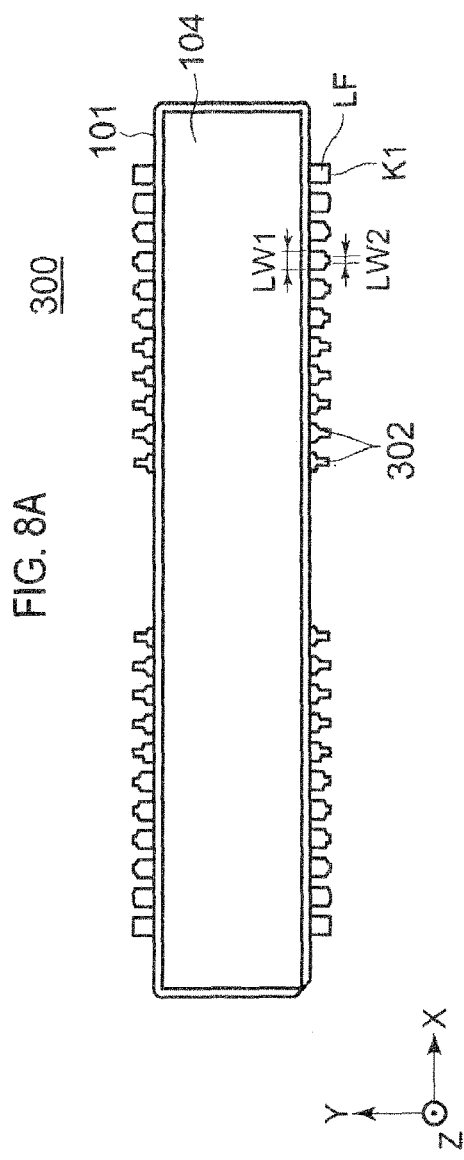
FIG. 8A is a top plan view showing a solid-state image sensing apparatus 300 according to Embodiment 3 of the invention.
Figure 8B:
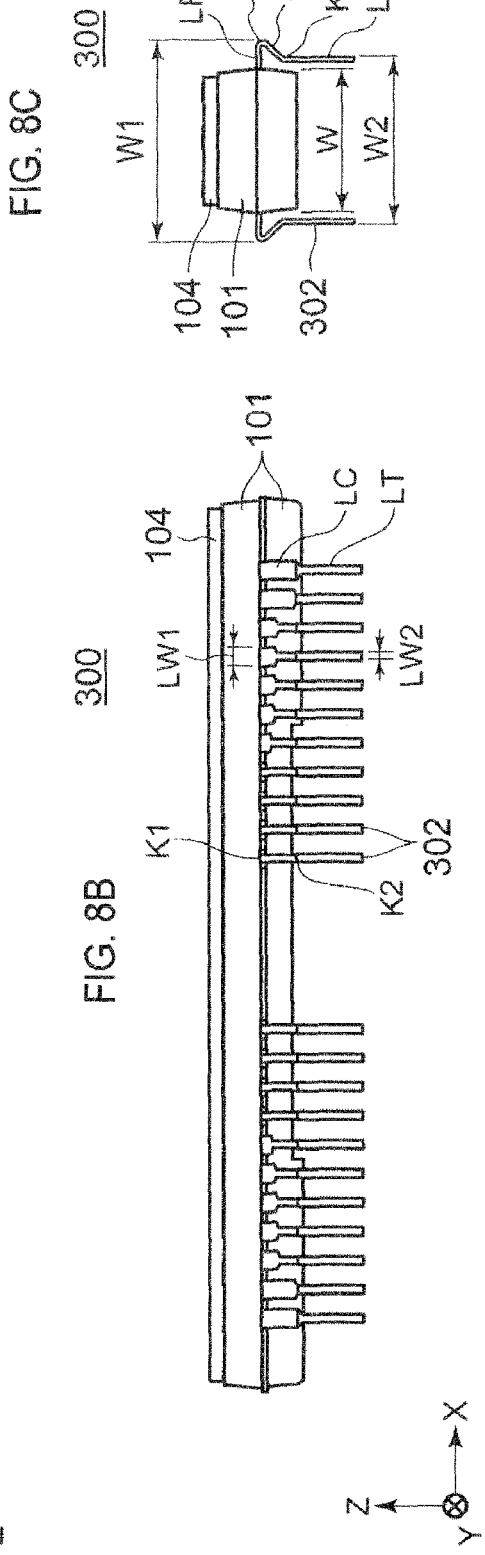
FIG. 8B is a side view of the solid-state image sensing apparatus 300 as seen in the y-direction.
Figure 8C:
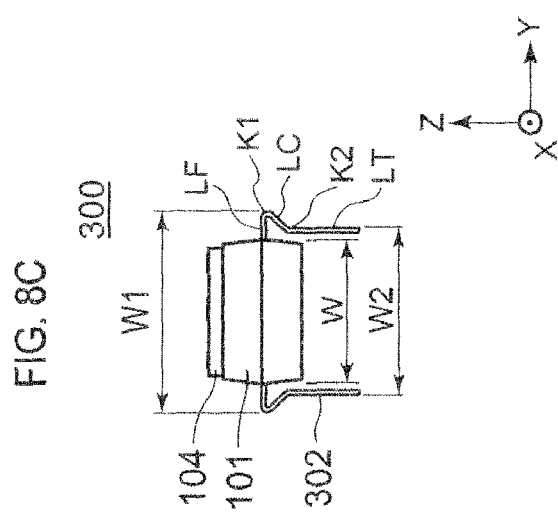
FIG. 8C is a side view of the solid-state image sensing apparatus 300 as seen in the x-direction.

FIG. 8A is a top plan view showing a solid-state image sensing apparatus 300 according to Embodiment 3 of the invention, FIG. 8B a side view of the solid-state image sensing apparatus 300 as seen in the y-direction, and FIG. 8C a side view of the solid-state image sensing apparatus 300 as seen in the x-direction. There is a tendency that a printed circuit board 20 is warped in an identical direction in the same electronic equipment. With the solid-state image sensing apparatus 300, it is intended to further control a warpage amount of a package body 101 by making positive use of such property against the printed circuit board 20 that is prone to be concavely warped.

The solid-state image sensing apparatus 300 has a feature in that the width of a horizontal portion LF is varied according to a position of each of outer leads 302 in contrast to the case of the solid-state image sensing apparatus 100. With the solid-state image sensing apparatus 300, a side-view shape thereof, shown in FIG. 8C, is not different from that for the solid-state image sensing apparatus 100, however, as shown in FIGS. 8A, 8B, respectively, it is seen that the outer leads 302 undergo gradual variation in width of a mid portion LC as well as the horizontal portion LF as respective positions of the outer leads 302 are shifted from around the center to the respective ends of the package body 101. The outer lead 302 positioned in the vicinity of the center has a shape similar to that of the outer lead 102 of the solid-state image sensing apparatus 100, however, the outer leads 302 are shaped such that as the position of the outer lead 302 is shifted toward the respective ends of the package body 101, so a proportion of a wider portion of the horizontal portion LF (the portion having the first width LW1) increases, and as the position of the outer lead 302 is further shifted toward the respective ends, a first bend K1, and a portion of the mid portion LC as well come to have the first width LW1. The solid-state image sensing apparatus 300 is formed such that a second bend K2 and an end portion LT each have the second width LW2 narrower than the first width LW1. Further, as in the case of the solid-state image sensing apparatus 100, the second bend K2 is formed above the bottom face of the package body 101, and the interval W2 between the second bends K2 is wider than the width W of the package body 101. The mid portion LC, the second bend K2, and an end portion LT are disposed directly below the horizontal portion LF.

FIG. 9 is a top plan view of the solid-state image sensing apparatus 300 prior to bending the outer leads 302. Alternate long and two short dashes lines indicate respective positions where the first bend K1, and the second bend K2 are slated to be formed. The second bend K2 is formed in respective portions of the outer leads 302, having the second width LW2, however, some of the first bends K1, adjacent to the respective ends of the package body 101, are formed in respective portions of the outer leads 302, having the first width LW1.

Figure 10A:
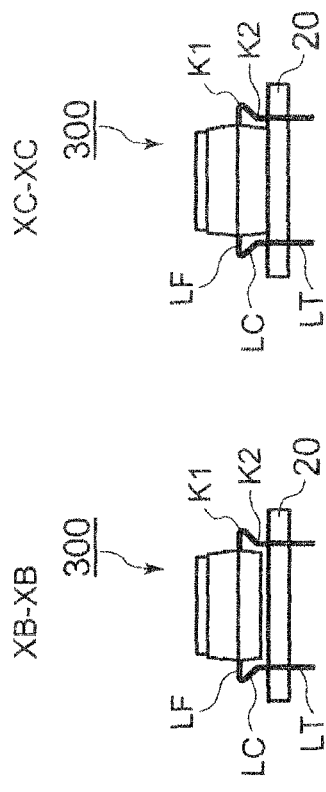
FIGS. 10A to 10C each are a view showing a printed circuit board 20 with the solid-state image sensing apparatus 300 mounted thereon, in as-unwarped state.
Figure 10B:
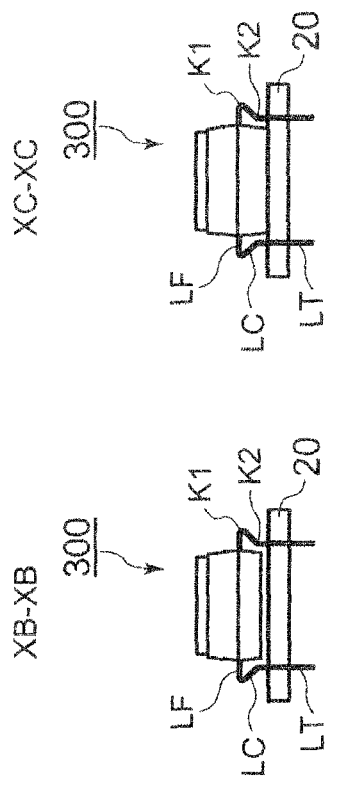
Figure 10C:
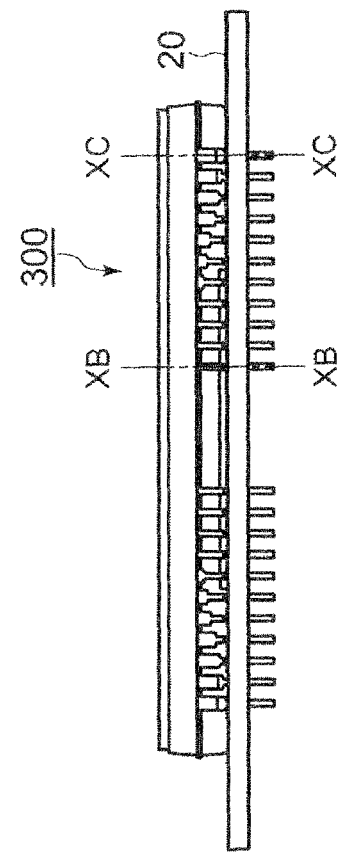
Figure 10D:
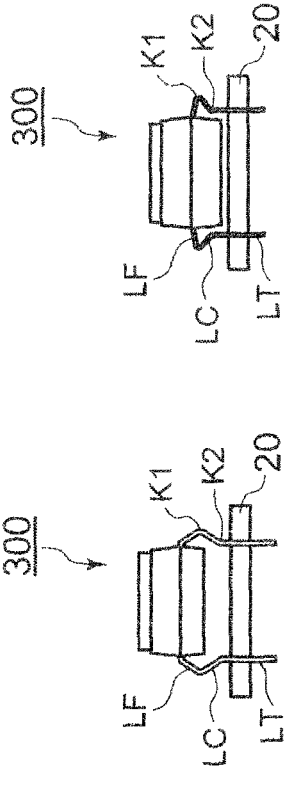
FIGS. 10D to 10F each are a view showing a printed circuit board 20 with the solid-state image sensing apparatus 300 mounted thereon, in as concavely-warped state.
Figure 10E:
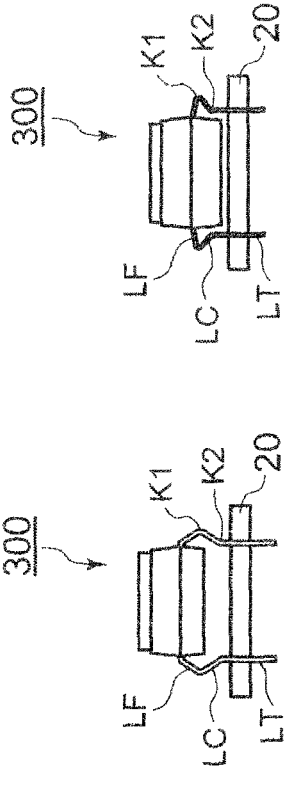
Figure 10F:
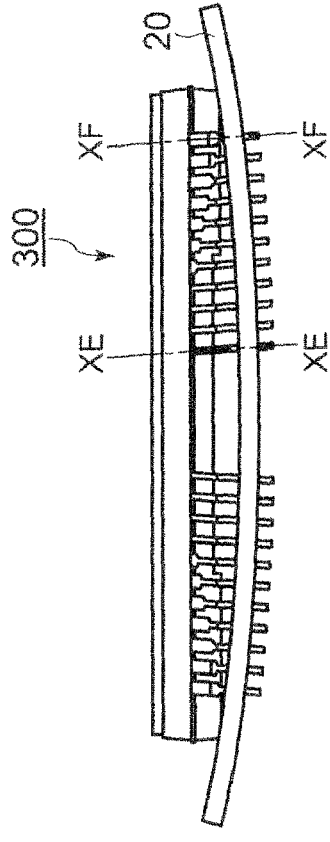

FIG. 10A is a side view of the solid-state image sensing apparatus 300 mounted on the printed circuit board 20, showing the printed circuit board 20 in as-unwarped state, and FIGS. 10B, 10C each are a sectional view taken on lines XB-XB, XC-XC, in FIG. 10A, respectively. FIG. 10D is a side view showing the printed circuit board 20 with the solid-state image sensing apparatus 300 mounted thereon, in as concavely-warped state, and FIGS. 10E, 10F each a sectional view taken on lines XE-XE, XF-XF, in FIG. 10D, respectively. Because an amount of dent of the printed circuit board 20 is larger at a point in the vicinity of the center of the package body 101, a force pulling the end portion LT downward is strong while the amount of the dent of the printed circuit board 20 is smaller at the respective ends of the package body 101, so that the force pulling the end portion LT downward becomes weaker. Therefore, the solid-state image sensing apparatus 300 has the respective outer leads 302 at the central part of the package body 101 which are provided with a longer narrower portion having the second width LW2 rather than a wider portion having the first width LW1, and are therefore susceptible to deformation, so that a stress applied to the package body 101 is absorbed with greater ease. On the other hand, because a stress applied to the respective ends of the package body 101 is normally smaller than that applied to the central part thereof to the extent that the amount of the dent of the printed circuit board 20 is smaller, if the outer leads 302 identical in shape to those at the central part are disposed at the respective ends of the package body 101, the stress applied to the respective ends of the package body 101 will be smaller. Accordingly, with the solid-state image sensing apparatus 300, the outer leads 302 positioned at the respective ends of the package body 101 are increased in rigidity with having a longer wider portion having the first width LW1, thereby increasing a stress applicable to the respective ends of the package body 101.

That is, the closer to the respective ends of the package body 101 the outer lead 302 is positioned, the higher is rendered a proportion of the portion of the outer lead 302, having the first width greater in width, thereby rendering the outer lead 302 insusceptible to deformation so as to supplement stress applied from the outer lead 302 to the package body 101 to the extent that the stress received from the printed circuit board 20 is less. By so doing, the stress applicable to the package body 101 can be equalized across from the center thereof to the respective ends, thereby further controlling deformation of the solid-state image sensing apparatus 300.

FIG. 11A is a top plan view showing a solid-state image sensing apparatus 400 according to Embodiment 4 of the invention, FIG. 11B a side view of the solid-state image sensing apparatus 400 as seen in the y-direction, and FIG. 11C a side view of the solid-state image sensing apparatus 400 as seen in the x-direction. The solid-state image sensing apparatus 400 represents an example where, in the case of a printed circuit board being prone to be convexly warped contrary to the case of the solid-state image sensing apparatus 300, insufficiency in stress applied to the central part of package body 101 is supplemented by increasing the rigidity of outer leads 402 with the use of the same techniques as used for the solid-state image sensing apparatus 300.

With the solid-state image sensing apparatus 400, the closer to a position in the vicinity of the center of the package body 101 the outer lead 402 is, the higher is rendered a proportion of a portion of the outer lead 402, having the first width LW1, thereby rendering the outer lead 402 insusceptible to deformation so as to supplement stress applied from the outer lead 402 to the package body 101 to the extent that the stress received from the printed circuit board (not shown) is less. By so doing, the stress applicable to the package body 101 can be equalized across from the center thereof to the respective ends, thereby further controlling deformation of the solid-state image sensing apparatus 400.

FIG. 12A is a top plan view showing a solid-state image sensing apparatus 500 according to Embodiment 5 of the invention, FIG. 12B a side view of the solid-state image sensing apparatus 500 as seen in the y-direction, and FIG. 12C a side view of the solid-state image sensing apparatus 500 as seen in the x-direction. The solid-state image sensing apparatus 500 has a feature in that, in contrast to the case of the solid-state image sensing apparatus 100, first bends K1 each are formed in an arc-like shape as shown in FIG. 12C. With each of the outer leads 502 of the solid-state image sensing apparatus 500, a second bend K2, and an end portion LT are disposed directly below a horizontal portion LF.

If it is difficult to work on the outer lead 502 so as to form an acute angle at the first bend K1 owing to quality of the base material of a lead frame, and property of a plating on the surface of the lead frame, warpage and twist of the package body 101. (that is, the solid-state image sensing chip) can be controlled by working on the outer lead 502 in such a way as to form the first bend K1 in the arc-like shape.

Figure 13A:
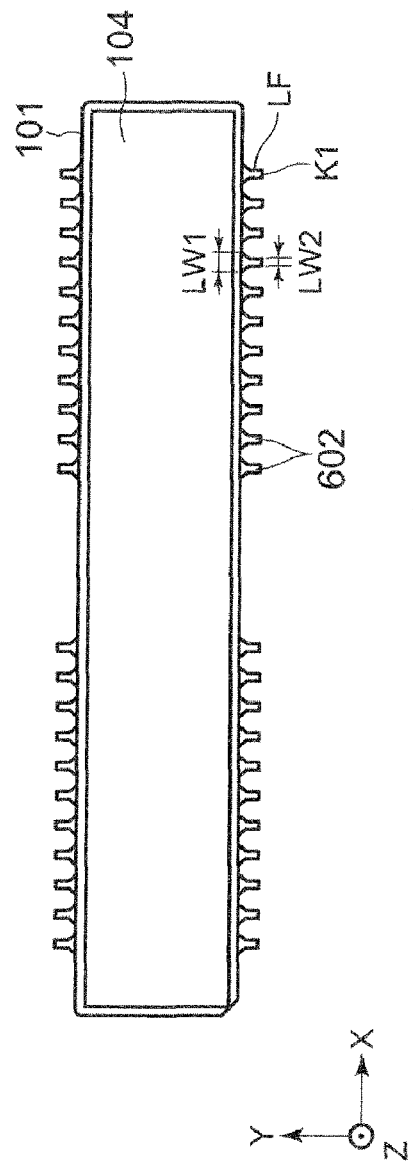
FIG. 13A is a top plan view showing a solid-state image sensing apparatus 600 according to Embodiment 6 of the invention.
Figure 13B:
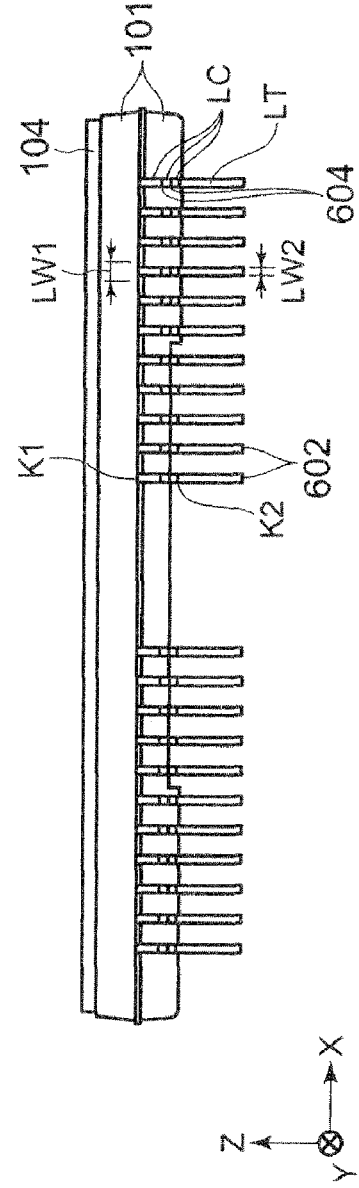
FIG. 13B is a side view of the solid-state image sensing apparatus 600 as seen in the y-direction.
Figure 13C:
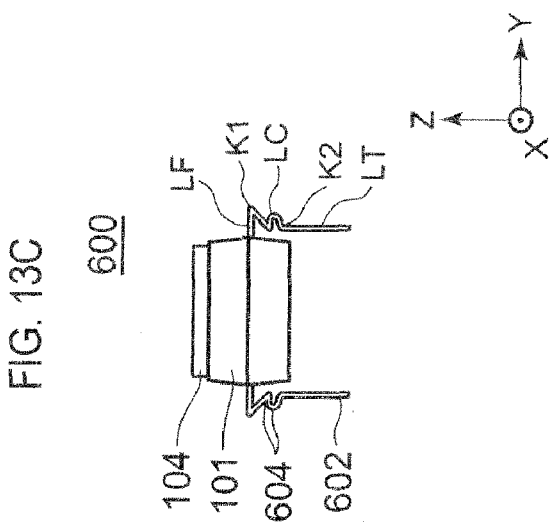
FIG. 13C is a side view of the solid-state image sensing apparatus 600 as seen in the x-direction.

FIG. 13A is a top plan view showing a solid-state image sensing apparatus 600 according to Embodiment 6 of the invention, FIG. 13B a side view of the solid-state image sensing apparatus 600 as seen in the y-direction, and FIG. 13C a side view of the solid-state image sensing apparatus 600 as seen in the x-direction. The solid-state image sensing apparatus 600 has a feature in that a mid portion LC of an outer lead 602 further has a bend 604 in addition to the feature of the solid-state image sensing apparatus 100. The bend 604 is formed so as to be positioned closer to a package body 101 than a first bend K1, and directly below a horizontal portion LF. As shown in FIG. 13C, the bend 604 is disposed directly below the horizontal portion LF, and is oriented in a direction differing from that for the bend 204 of the solid-state image sensing apparatus 200. A second bend K2 is formed above the bottom face of a package body 101 as is the case with the solid-state image sensing apparatus 100.

With the solid-state image sensing apparatus 600, not only the horizontal portion LF, the first bend K1, and the second bend K2 but also the bend 604 undergoes deformation, so that the effect of preventing warpage and twist of the package body 101 (that is, the solid-state image sensing chip) is enhanced. Furthermore, because the bend 604 is disposed directly below the horizontal portion LF, even if a pitch between the outer leads 602 adjacent to each other becomes narrower, there is no need for downsizing the bend 604, so that the effect of preventing the warpage and twist of the package body 101 (that is, the solid-state image sensing chip) will be greater as compared with the case of the solid-state image sensing apparatus 200.

Figure 14C:
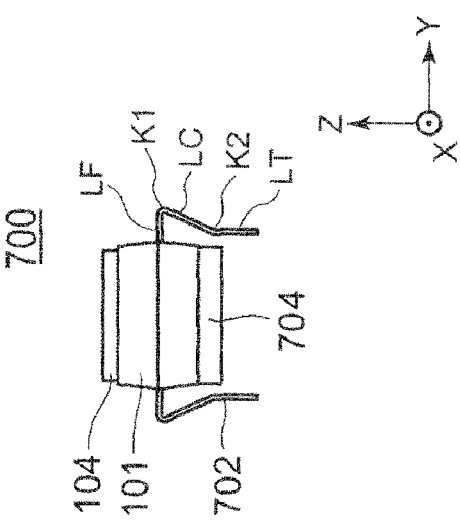
FIG. 14C is a side view of the solid-state image sensing apparatus 700 as seen in the x-direction.
Figure 14A:
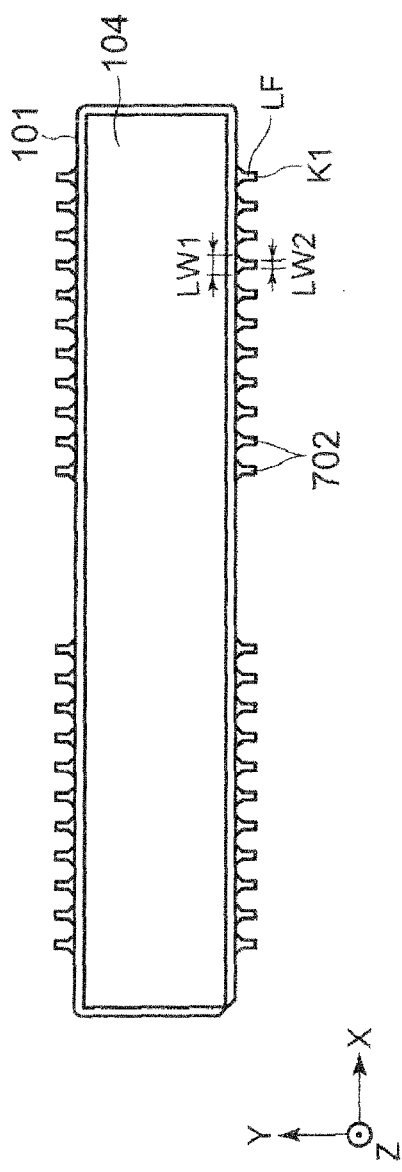
FIG. 14A is a top plan view showing a solid-state image sensing apparatus 700 according to Embodiment 7 of the invention.
Figure 14B:
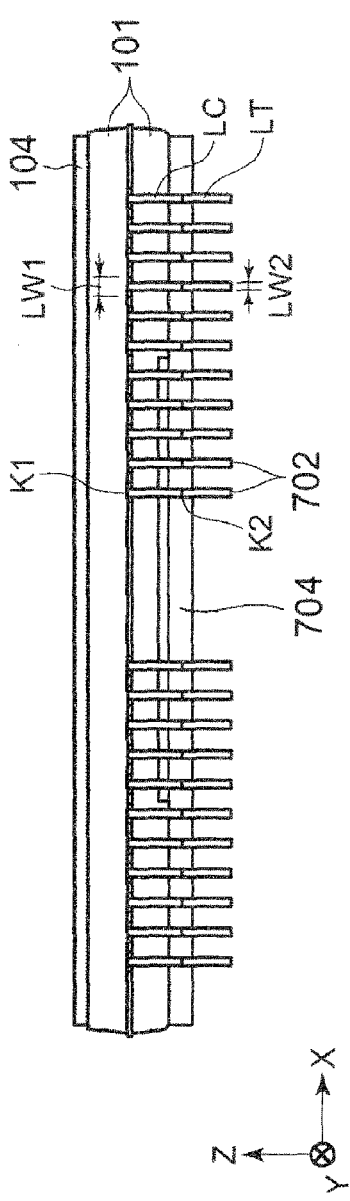
FIG. 14B is a side view of the solid-state image sensing apparatus 700 as seen in the y-direction.

FIG. 14A is a top plan view showing a solid-state image sensing apparatus 700 according to Embodiment 7 of the invention, FIG. 14B a side view of the solid-state image sensing apparatus 700 as seen in the y-direction, and FIG. 14C a side view of the solid-state image sensing apparatus 700 as seen in the x-direction. In the case where the bottom face of a package body 101 is brought into close contact with a printed circuit board (not shown) with a heat radiation sheet 704 sandwiched therebetween, a second bend K2 of an outer lead 702 is satisfactorily formed above the bottom face of the heat radiation sheet 704, and may be formed so as to be positioned below the bottom face of the package body 101. FIGS. 14B, and 14C each show an example wherein the second bend K2 is formed so as to be positioned below the bottom face of the package body 101, but above the bottom face of the heat radiation sheet 704.

With the solid-state image sensing apparatuses 100 to 600, respectively, the bottom face of the package body 101 may be brought into close contact with the printed circuit board with the heat radiation sheet 704 sandwiched therebetween.

WORKING EXAMPLES

Lead frames that are identical in material quality and shape to each other were prepared, and samples of a variety of solid-state image sensing apparatuses, each comprising outer leads formed in various shapes, were prepared, whereupon measurements were taken on a warpage amount of a solid-state image sensing chip 803 against a warpage amount of a printed circuit board 820 for use in testing.

Figure 15A:
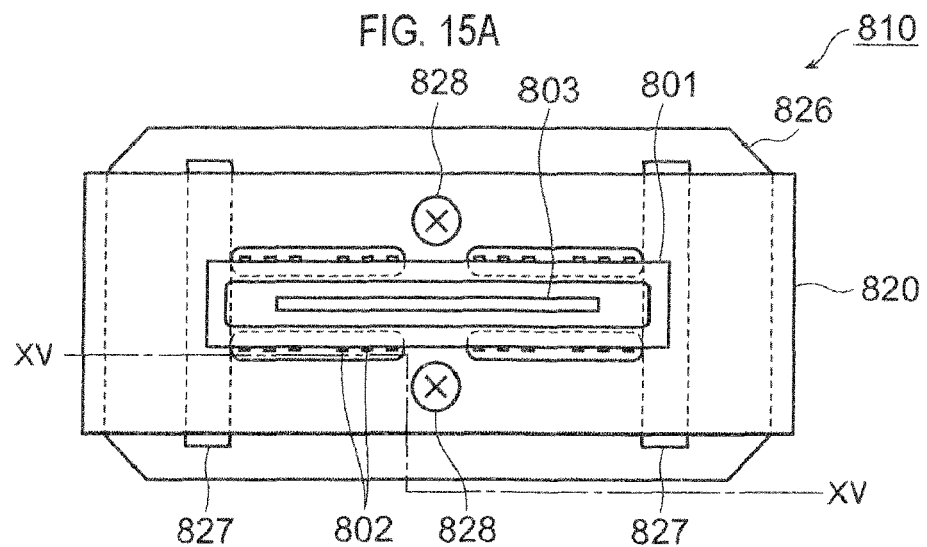
FIG. 15A is a schematic top plan view showing a method for measuring the warpage amount of the printed circuit board 820 for use in testing, and the warpage amount of the solid-state image sensing chip 803, using an evaluation sample 810.
Figure 15B:
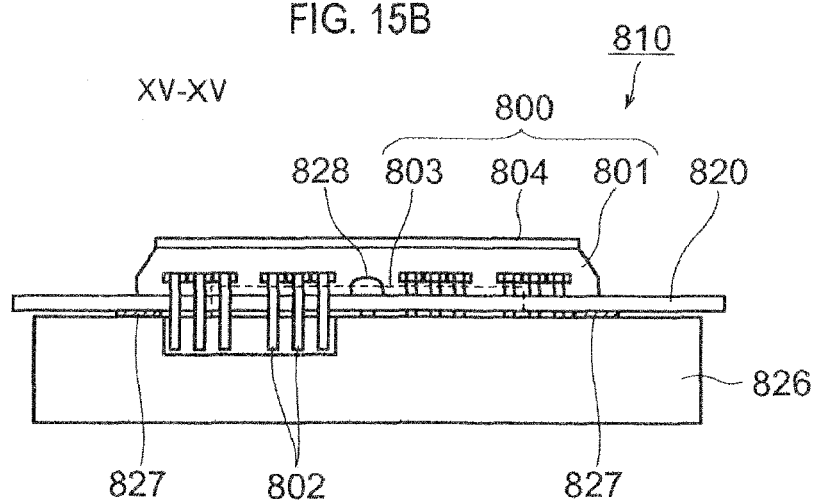
FIG. 15B a schematic side view of the evaluation sample 810 when warpage stress was zero.
Figure 15C:
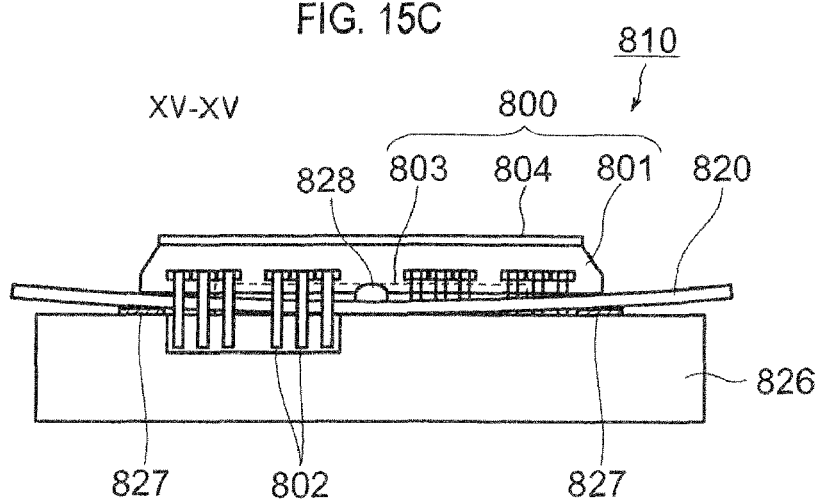
FIG. 15C a schematic side view of the evaluation sample 810 when warpage stress was applied.

FIG. 15A is a schematic top plan view showing a method for measuring the warpage amount of the printed circuit board 820 for use in testing, and the warpage amount of the solid-state image sensing chip 803, using an evaluation sample 810, FIG. 15B a schematic side view of the evaluation sample 810 when warpage stress was zero, and FIG. 15C a schematic side view of the evaluation sample 810 when warpage stress was applied. There were prepared samples 800 for solid-state image sensing apparatuses fabricated by mounting the solid-state image sensing chip 803 in respective package bodies 801 provided with a variety of outer lead structures to be sealed by transparent sheet 104, and outer leads 802 were inserted into respective holes of the printed circuit board 820 to be secured thereto by soldering, having thereby completed the evaluation samples 810. The evaluation sample 810 was placed over a metal block 826 with spacers 827 disposed at respective ends of the metal block 826, sandwiched therebetween, whereupon the printed circuit board 820 was fixedly attached to the metal block 826 by screws 828. An interval between spacers 827 was 48 mm, the long side of the package body was 55 mm in length, and the long side of the solid-state image sensing chip 803 was 43 mm in length. As for the spacers 827, there were prepared 4 types thereof, 30 μm, 50 μm, 100 μm, and 150 μm, respectively, in thickness. By tightening up the respective screws 828, the printed circuit board 820 for testing was caused to undergo warpage in a concave direction according to various thicknesses of the spacer 827 as shown in FIG. 15C. Thereafter, respective warpage amounts of the printed circuit board 820, and the solid-state image sensing chip 803 were measured with the use of a laser shape-measuring instrument (not shown). A measurement range was a range covering 35 mm in length at the central part of the evaluation sample 810, and measurement was taken at 35 points at 1 mm pitches.

Now, samples 800 for solid-state image sensing apparatuses fabricated by mounting the solid-state image sensing chip 803 will be described. Samples 1, and 5 each were a sample of a solid-state image sensing apparatus wherein the material of a package body was a synthetic resin, and outer leads each were bent so as to be in a triangle-like shape as in the case of the solid-state image sensing apparatus 100. Sample 2 was a sample of a solid-state image sensing apparatus wherein the material of a package body was the synthetic resin, and outer leads each were formed so as to be bent in the shape resembling the letter S, as is the case with the conventional solid-state image sensing apparatus 10. For the sake of comparison, there were also prepared Samples 3, and 4, wherein respective outer leads did not have a bend. With Sample 3, the material of a package body was a synthetic resin, and with Sample 4, the material of a package body was ceramic.

The material of each Samples 1 to 5 of the lead frames was a copper alloy, 0.25 mm in thickness, the total number of the outer leads was 44, the outer leads each were 0.46 mm in width (excluding a width of a root portion of the outer lead, protruding from a package body), and an interval between the outer leads was set to 1.3 mm. The shapes of the outer leads prior to bending of the Samples 1 to 5 are in the same configuration to each other.

With Sample 1, a distance between a side face of the package body, and the vertex of a first bend K1 was 2.3 mm, the radius of an inner curvature of the first bend K1 was not more than 0.2 mm, and an angle formed between a horizontal portion LF, and a mid portion LC was 45 degrees. A second bend K2, and an end portion LT each were positioned directly below the horizontal portion LF, and a distance from a line vertically extended along the side face of the package body to the second bend K2, and the end portion LT, respectively, was 0.56 mm. With Sample 5, the triangle-like shape of the outer lead was rendered smaller in size than that for sample 1, and a distance between a side face of package body, and the corner of a first bend K1 was 1.7 mm. Otherwise, Sample 5 was identical to Sample 1.

Figure 1:
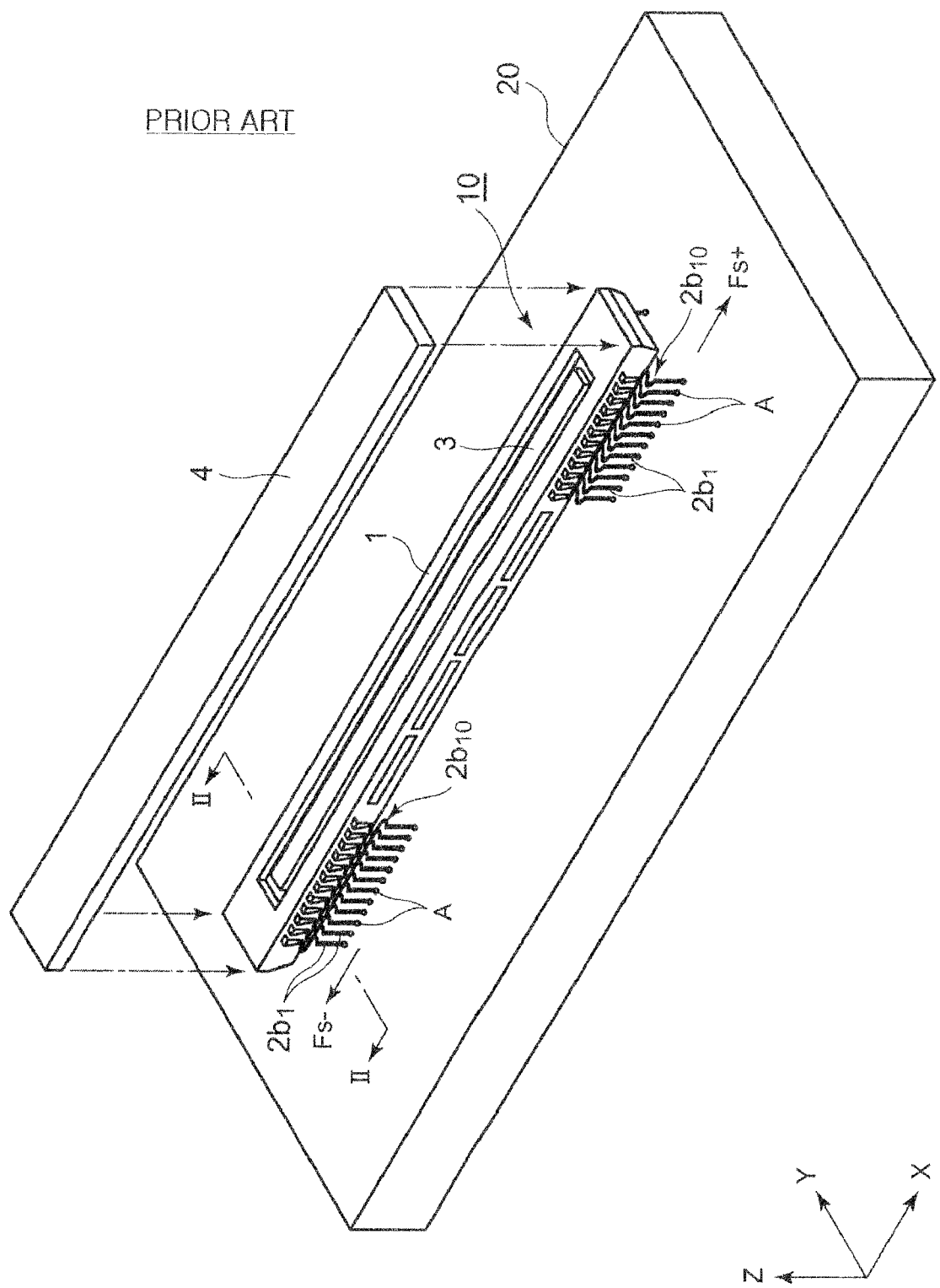
FIG. 1 is a perspective view of a conventional solid-state image sensing apparatus 10.
Figure 2:
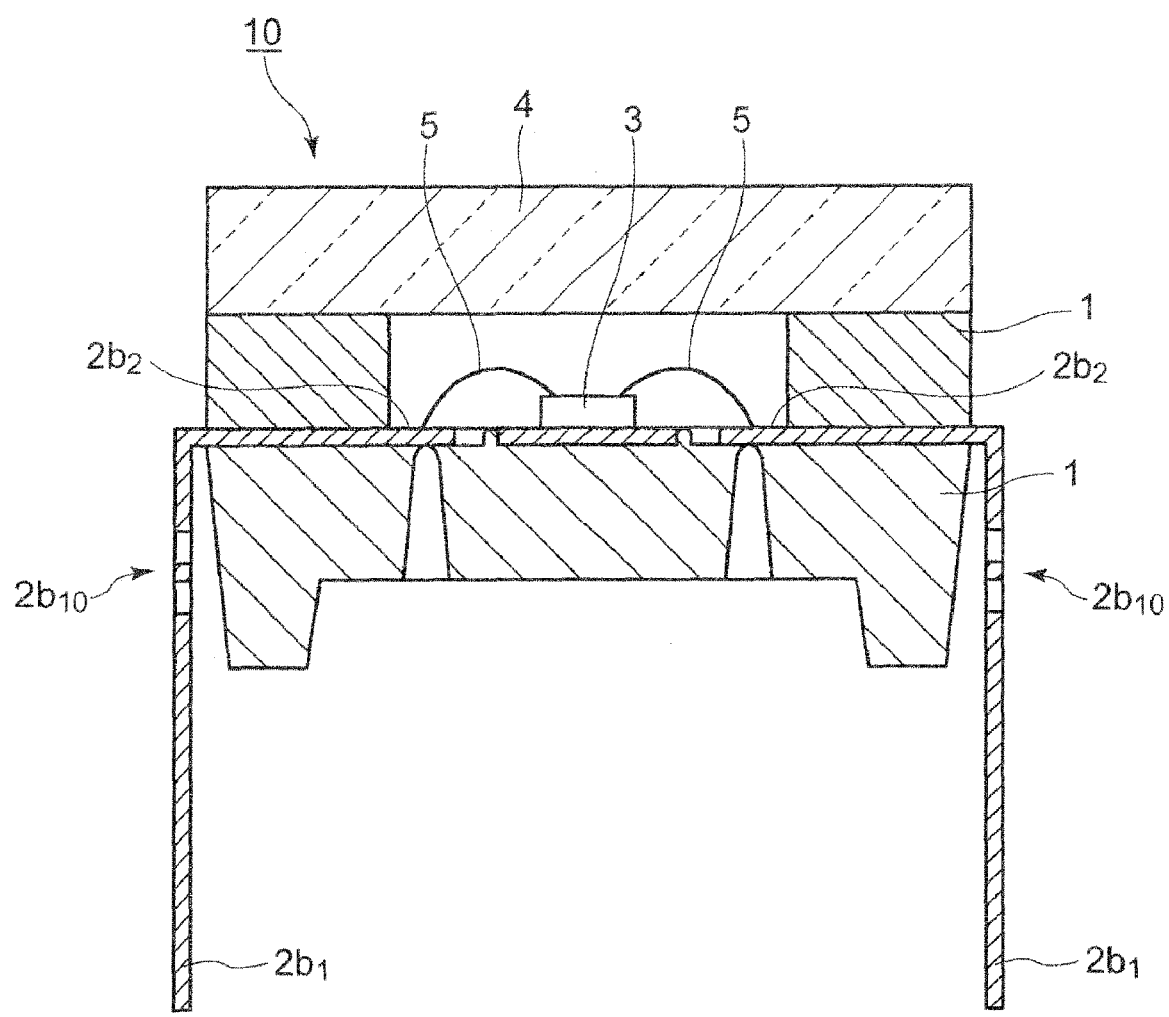
FIG. 2 is a sectional view taken on line II-II of FIG. 1.
Figure 3A:
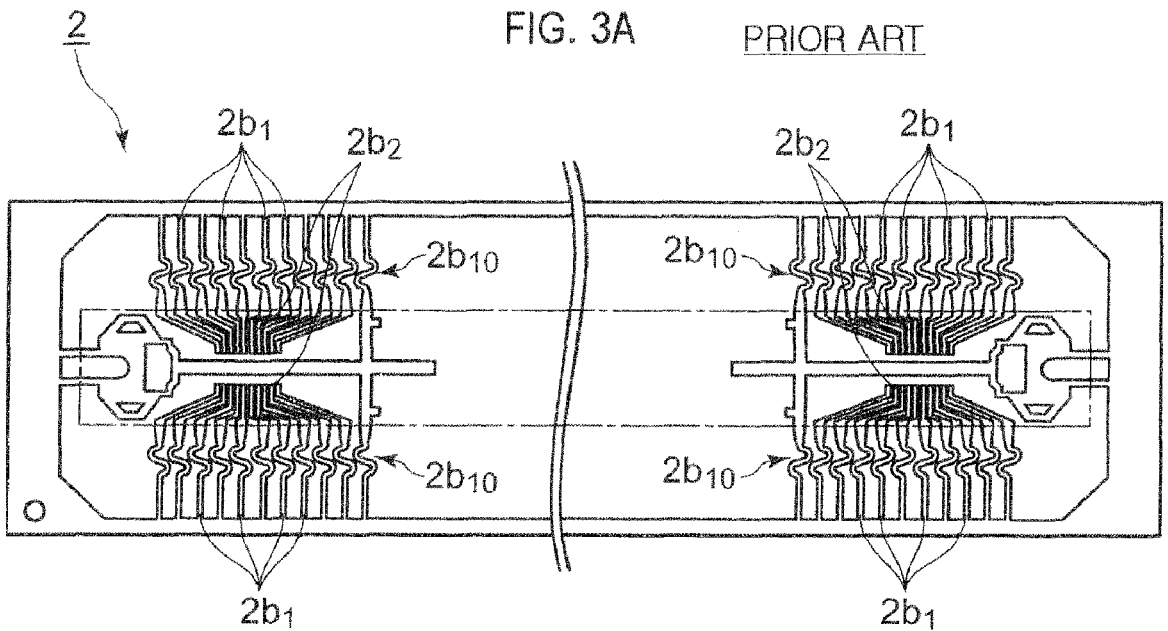
FIG. 3A is a plan view of a lead frame 2 used in the solid-state image sensing apparatus 10.
Figure 3B:
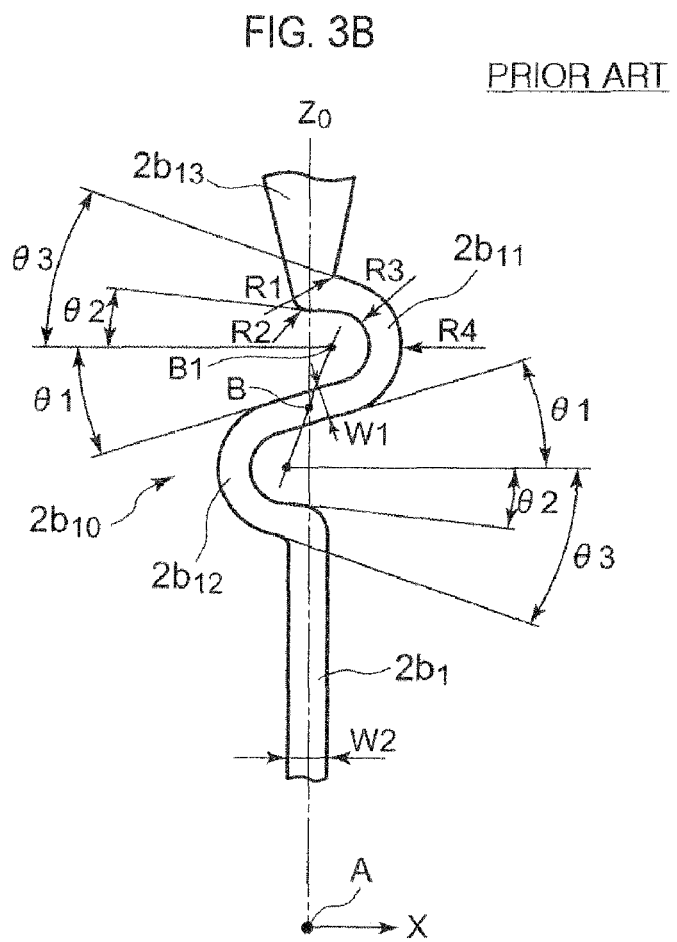
FIG. 3B is a detailed plan view of outer leads $2b_1$.
Figure 4:
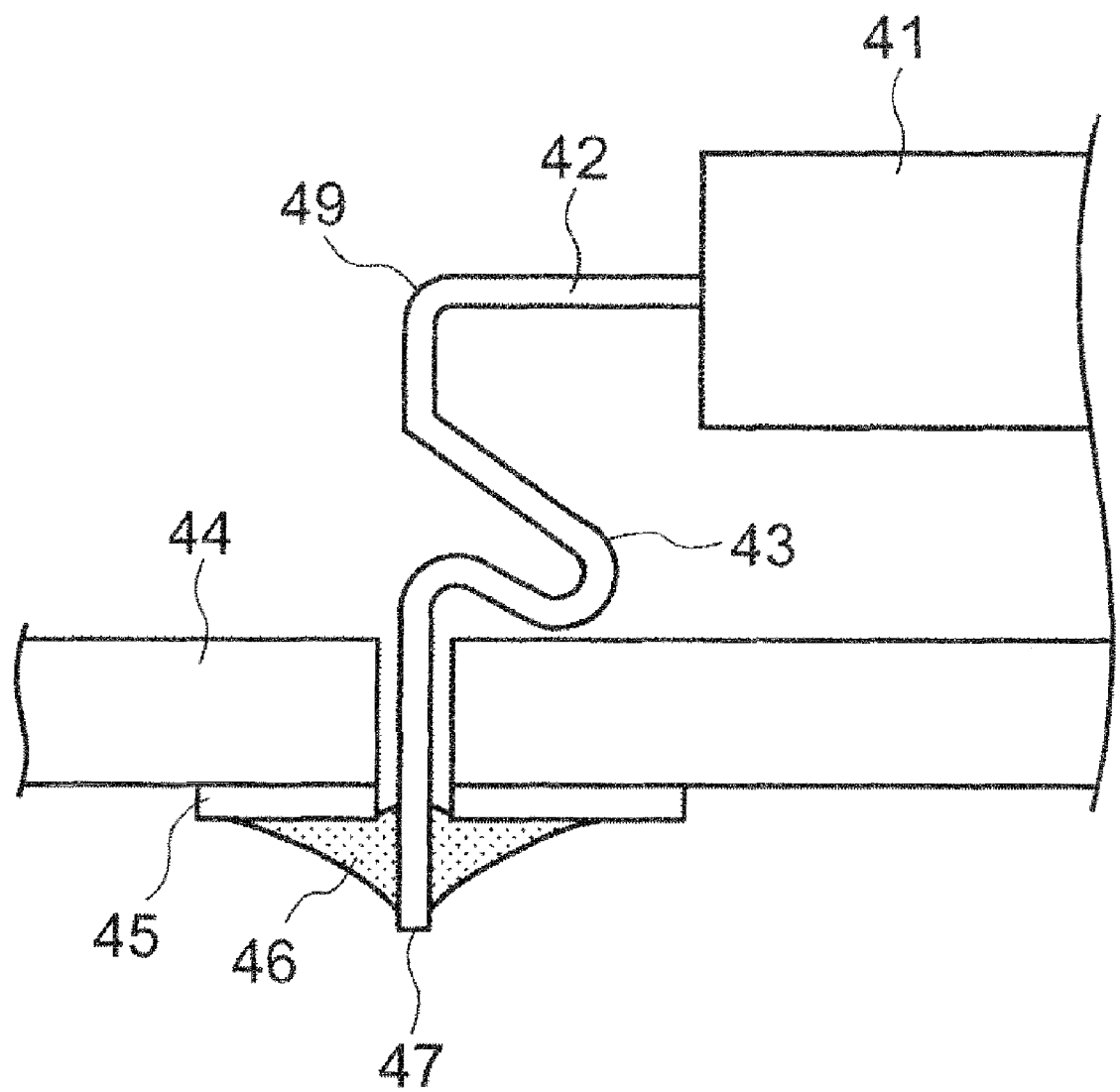
FIG. 4 is a partially sectional view of another conventional solid-state image sensing apparatus.

With Sample 2, a distance from a side face of the package body to a bend from which an outer lead was vertically extended was 0.25 mm, the radius (corresponding to R3 in FIG. 3B) of an inner curvature of a bend of a bend portion in the shape resembling the letter S was 0.15 mm, and the outer hull of the bend portion was 1 mm in width. With Samples 3, and 4, respectively, a distance from a side face of the package body to a bend from which an outer lead was vertically extended was 0.25 mm.

Figure 16:
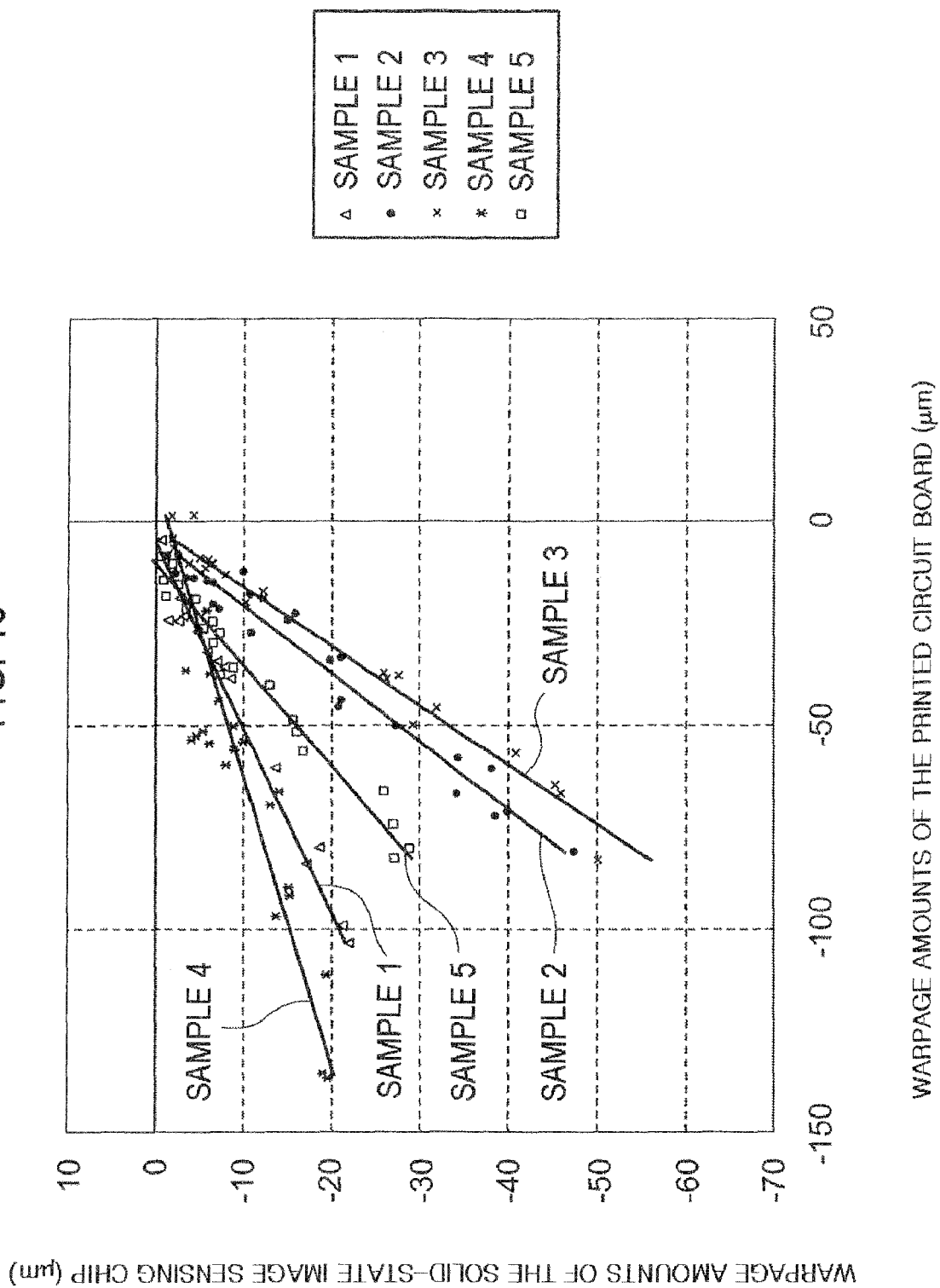
FIG. 16 is a graph formed by plotting warpage amounts (measured values) of the solid-state image sensing chip 803 against warpage amounts (measured values) of the printed circuit board 820 with respect to Samples according to Embodiment 1 of the invention, and Samples for comparative purposes, respectively.

FIG. 16 is a graph formed by plotting warpage amounts (measured values) of the solid-state image sensing chip 803 against warpage amounts (measured values) of the printed circuit board 820 with respect to Sample 1, and 5, according to Embodiment 1 of the invention, and Samples 2 to 4 for comparative purposes, respectively, thereby drawing approximate straight lines interconnecting respective plotted points. With Samples 1 to 5, respectively, use was made of 4 to 5 pieces of specimens. Each of the plotted points in the graph was one of 35 points where measurement was taken at 1 mm pitches per one specimen, and a warpage amount was found at the maximum.

With Sample 4, since the package body was made of ceramic, the package body had extremely strong rigidity, so that the slope of the approximate straight line representing the warpage amount of the solid-state image sensing chip against the warpage amount of the printed circuit board for testing was found most gentle. With Sample 3 wherein the material of the package body was simply changed from the ceramic to the synthetic resin, the rigidity of the package body was lowered, so that the slope of the approximate straight line was found most steep, and variation in the warpage amount was found large. With Sample 2, variation in the warpage amount was found less than that for Sample 3, but much improvement was not found. With Sample 1 even though the package body was made of the synthetic resin, the slope of the approximate straight line was found close to that for Sample 4 wherein the package body was made of ceramic, indicating significant improvement in performance. Accordingly, this proved that it was possible to obtain a solid-state image sensing apparatus bearing comparison with one using ceramic even though a synthetic resin lower in cost than ceramic was used in the former. With Sample 5, appreciable improvement in performance over Samples 2, and 3, respectively, was observed, however, an effect of the improvement was less than that in the case of Sample 1. It is apparent by caparison of Sample 1 with Sample 5 that the larger the triangle-like shape is, the greater is the effect of absorbing warpage stress.

Further, with respect to Sample 2, assuming that the radius of an inner curvature of an outer lead thereof, resembling the letter S (a bend portion), and a width of the letter S (the bend portion) are increased, it is possible to improve somewhat the slope of the approximate straight line representing the warpage amount. However, there is limitations to such improvement because the width of the letter S (the bend portion) should be limited to not more than a half of a pitch between the outer leads adjacent to each other in order to prevent contact (short circuit) therebetween.

In contrast, with Samples 1, and 5, respectively, even if a horizontal portion LF, and a mid portion LC are changed in length, respectively, and a first bend K1 and a second bend K2 are changed in angle, respectively, there will be no risk of occurrence of contact (short circuit) between outer leads adjacent to each other. Accordingly, a solid-state image sensing apparatus more excellent in performance can be obtained.

Although the invention has been described as above with reference to several preferred embodiments thereof, it will be appreciated by those skilled in the art that those embodiments

What is claimed is:

1. A solid-state image sensing apparatus comprising:
   a solid-state image sensing chip;
   a package body encasing the solid-state image sensing chip therein; and
   a plurality of outer leads, the outer leads each comprising:
   a horizontal portion protruding in the horizontal direction from a side face of the package body;
   a distal end extending in a direction orthogonal to the horizontal portion, and disposed directly below the horizontal portion;
   a mid portion positioned between the horizontal portion and the distal end;
   a first bend of more than 90° between the horizontal portion and the mid portion; and
   a second bend of less than 90° between the mid portion and the distal end.

2. The solid-state image sensing apparatus according to claim 1, wherein the mid portion is disposed directly below the horizontal portion.

3. The solid-state image sensing apparatus according to claim 2, wherein a triangle is formed by an intersection between a line extended upward from a center line of the distal end and the horizontal portion, the first bend, and the second bend.

4. The solid-state image sensing apparatus according to claim 3, wherein the triangle is a right isosceles triangle.

5. The solid-state image sensing apparatus according to claim 1, wherein the second bend is positioned above a bottom face of the package body.

6. The solid-state image sensing apparatus according to claim 1, wherein the mid portion has a bend.

7. The solid-state image sensing apparatus according to claim 6, wherein the bend formed in the mid portion is disposed directly below the horizontal portion.

8. The solid-state image sensing apparatus according to claim 6, wherein the bend formed in the mid portion is disposed at a position deviated from directly below the horizontal portion.

9. The solid-state image sensing apparatus according to claim 1, wherein the first bend is formed in an arc-like shape.

10. The solid-state image sensing apparatus according to claim 1, wherein the second bend is substantially identical in width to the distal end.

11. The solid-state image sensing apparatus according to claim 10, wherein the plurality of the outer leads are classified into first and second groups, the horizontal portion of the outer lead in the first group has a portion having a first width, and a portion having a second width narrower than the first width while the outer lead in the second group comprises the horizontal portion having the first width, and the mid portion having a portion having the first width, and a portion having the second width.

12. The solid-state image sensing apparatus according to claim 10, wherein the plurality of the outer leads include a first group of leads, wherein the horizontal portion of the outer lead in the first group has a portion having a first width and a portion having a second width narrower than the first width.

13. The solid-state image sensing apparatus according to claim 1, wherein a material of the package body is a synthetic resin.

14. The solid-state image sensing apparatus according to claim 1, further comprising:
   a heat radiation sheet assembled on a bottom face of the package body.

15. The solid-state image sensing apparatus according to claim 14, wherein the second bend is positioned between the bottom face of the package body and a bottom face of the heat radiation sheet.

16. A package of a solid-state image sensing apparatus, said package comprising:
   a package body capable of encasing a solid-state image sensing chip therein; and
   a plurality of outer leads, the outer leads each comprising:
   a horizontal portion protruding in the horizontal direction from a side face of the package body;
   a distal end extending in a direction orthogonal to the horizontal portion, and disposed directly below the horizontal portion;
   a mid portion positioned between the horizontal portion and the distal end;
   a first bend of more than 90° between the horizontal portion and the mid portion; and
   a second bend of less than 90° between the mid portion and the distal end.

17. A solid-state image sensing apparatus comprising:
   a solid-state image sensing chip;
   a package body encasing the solid-state image sensing chip therein; and
   a plurality of outer leads, the outer leads each comprising:
   a horizontal portion protruding in the horizontal direction from a side face of the package body;
   an end portion extending in a direction orthogonal to the horizontal portion, and disposed directly below the horizontal portion;
   a mid portion positioned between the horizontal portion and the end portion;
   a first bend formed between the horizontal portion and the mid portion; and
   a second bend formed between the mid portion and the end portion,
   wherein the second bend is substantially identical in width to the end portion,
   wherein the plurality of the outer leads includes a first group of leads, the horizontal portion of the outer lead in the first group having a portion having a first width and a portion having a second width narrower than the first width,
   wherein each of the first bend and the second bend has a width identical to the second width.

* * * * *